(12) United States Patent
Kim et al.

(10) Patent No.: US 11,373,909 B2
(45) Date of Patent: *Jun. 28, 2022

(54) SEMICONDUCTOR DEVICES HAVING FIN-SHAPED ACTIVE REGIONS

(71) Applicant: Samsung Electronics Co., Ltd., Suwon-si (KR)

(72) Inventors: Sung-Min Kim, Incheon (KR); Dong-won Kim, Seongnam-si (KR); Geum-jong Bae, Suwon-si (KR)

(73) Assignee: Samsung Electronics Co., Ltd.

( * ) Notice: Subject to any disclaimer, the term of this patent is extended or adjusted under 35 U.S.C. 154(b) by 264 days.

This patent is subject to a terminal disclaimer.

(21) Appl. No.: 16/845,683

(22) Filed: Apr. 10, 2020

(65) Prior Publication Data
US 2020/0243395 A1 Jul. 30, 2020

Related U.S. Application Data

(63) Continuation of application No. 16/023,621, filed on Jun. 29, 2018, now Pat. No. 10,658,244.

(30) Foreign Application Priority Data

Sep. 15, 2017 (KR) .......................... 10-2017-0118837

(51) Int. Cl.
*H01L 21/8234* (2006.01)
*H01L 21/762* (2006.01)
*H01L 27/088* (2006.01)
*H01L 29/66* (2006.01)
*H01L 29/78* (2006.01)

(52) U.S. Cl.
CPC ................ *H01L 21/823431* (2013.01); *H01L 21/76232* (2013.01); *H01L 21/823481* (2013.01); *H01L 27/0886* (2013.01); *H01L 29/6681* (2013.01); *H01L 29/66818* (2013.01); *H01L 29/785* (2013.01); *H01L 29/7854* (2013.01)

(58) Field of Classification Search
CPC ....... H01L 21/823431; H01L 21/76232; H01L 21/823481; H01L 27/0886; H01L 29/6681; H01L 29/66818; H01L 29/785; H01L 29/7854; H01L 29/0684; H01L 29/66795; H01L 29/7855; H01L 29/4236; H01L 29/7831
USPC ........................................................ 257/401
See application file for complete search history.

(56) References Cited

U.S. PATENT DOCUMENTS 8,881,066 B2 11/2014 Shieh et al.
8,987,831 B2 3/2015 Liaw
(Continued)

FOREIGN PATENT DOCUMENTS

JP 2013-058688 A 3/2013
KR 10-2016-0095454 A 8/2016

*Primary Examiner* — Thao X Le
*Assistant Examiner* — Gardner W. S. Swan
(74) *Attorney, Agent, or Firm* — Myers Bigel, P.A.

(57) ABSTRACT

Semiconductor devices are provided. A semiconductor device includes a substrate including a device region defined by a trench in the substrate. The semiconductor device includes a plurality of fin-shaped active regions spaced apart from each other in the device region and extending in a first direction. The semiconductor device includes a protruding pattern extending along a bottom surface of the trench. Moreover, an interval between the protruding pattern and the plurality of fin-shaped active regions is greater than an interval between two adjacent ones of the plurality of fin-shaped active regions.

20 Claims, 19 Drawing Sheets

(56) References Cited

U.S. PATENT DOCUMENTS

| | | |
|---|---|---|
| 9,177,820 B2 | 11/2015 | Bergendahl et al. |
| 9,209,037 B2 | 12/2015 | Cantone et al. |
| 9,318,342 B2 | 4/2016 | Xie et al. |
| 9,455,198 B1 | 9/2016 | Yu et al. |
| 9,564,446 B1 | 2/2017 | Weybright et al. |
| 2013/0065326 A1 | 3/2013 | Sudo |
| 2013/0277720 A1 | 10/2013 | Kim et al. |
| 2015/0069528 A1 | 3/2015 | Chiang et al. |
| 2016/0056045 A1 | 2/2016 | Huang et al. |
| 2016/0163701 A1 | 6/2016 | Cheng et al. |
| 2016/0225635 A1 | 8/2016 | Lee et al. |

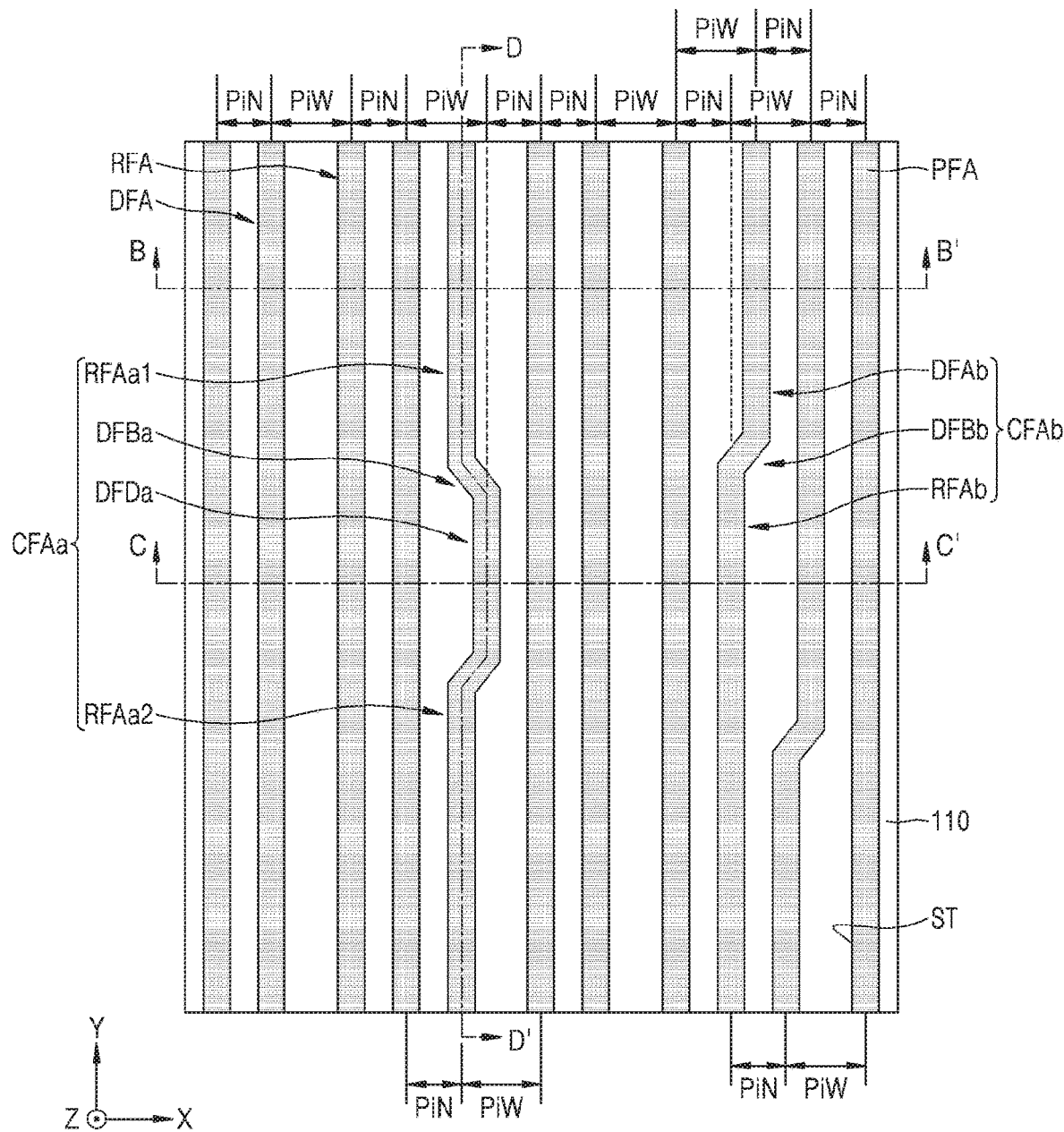

SEMICONDUCTOR DEVICES HAVING FIN-SHAPED ACTIVE REGIONS

CROSS-REFERENCE TO RELATED APPLICATION

This U.S. non-provisional application is a continuation of and claims priority from U.S. patent application Ser. No. 16/023,621, filed on Jun. 29, 2018, which claims the benefit of Korean Patent Application No. 10-2017-0118837, filed on Sep. 15, 2017, in the Korean Intellectual Property Office, the disclosures of which are hereby incorporated herein in their entirety by reference.

BACKGROUND

The present disclosure relates to semiconductor devices. With the rapid spread of information media in recent years, functions of semiconductor devices have been dramatically developed. In order to secure competitiveness and to achieve high integration of products with low cost and high quality, scaling down of the semiconductor devices has been performed.

To scale down semiconductor devices, a transistor has been developed in which a fin-shaped active region protruding from a substrate is formed and then a gate electrode is formed on the fin-shaped active region. The transistor formed in the fin-shaped active region may have improved current control capability and may not suffer from a short channel effect (SCE).

SUMMARY

The present inventive concepts provide a highly integrated semiconductor device having a fin-shaped active region.

According to example embodiments of the present inventive concepts, a semiconductor device may include a substrate including a device region defined by a trench in the substrate. The semiconductor device may include a plurality of fin-shaped active regions spaced apart from each other in the device region and extending in a first direction. Moreover, the semiconductor device may include a plurality of protruding patterns extending along a bottom surface of the trench. One of the plurality of protruding patterns may extend from a lower end of a sidewall of the device region. Adjacent ones of the plurality of fin-shaped active regions may be spaced apart from each other at a first pitch in a second direction perpendicular to the first direction. The plurality of protruding patterns and the plurality of fin-shaped active regions may be spaced apart from each other at a second pitch in the second direction, and the second pitch may be greater than the first pitch.

A semiconductor device, according to example embodiments of the present inventive concepts, may include a substrate including a device region defined by a trench in the substrate. The semiconductor device may include a plurality of fin-shaped active regions spaced apart from each other in the device region and extending in a first direction. The semiconductor device may include a plurality of protruding patterns extending along a bottom surface of the trench. Moreover, an interval between the plurality of protruding patterns and the plurality of fin-shaped active regions may be greater than an interval between two adjacent ones of the plurality of fin-shaped active regions.

A semiconductor device, according to example embodiments of the present inventive concepts, may include a substrate including a device region defined by a trench in the substrate. The semiconductor device may include a plurality of fin-shaped active regions spaced apart from each other at a first pitch in the device region and extending in a first direction. The semiconductor device may include a protruding pattern extending along a bottom surface of the trench from a lower end of a sidewall of the device region. The semiconductor device may include an isolation layer on lower portions of sidewalls of the plurality of fin-shaped active regions, on the sidewall of the device region, and on the protruding pattern. Moreover, the semiconductor device may include a plurality of gate structures spaced apart from each other and extending in a second direction on the isolation layer and on the plurality of fin-shaped active regions. Each of the plurality of gate structures may include a gate dielectric film and a gate conductive layer intersecting the plurality of fin-shaped active regions. The protruding pattern and the plurality of fin-shaped active regions may be spaced apart from each other at a second pitch greater than the first pitch in the second direction.

BRIEF DESCRIPTION OF THE DRAWINGS

Example embodiments of the present inventive concepts will be more clearly understood from the following detailed description taken in conjunction with the accompanying drawings in which:

FIGS. 1A, 1B, 1C, 1D, 2A, 2B, 2C, 2D, 3A, 3B, 3C, 3D, 4A, 4B, 4C, 4D, 5A, 5B, 5C, and 5D illustrate views of a method of manufacturing (e.g., forming) a semiconductor device, according to some example embodiments of the present inventive concepts. In particular, FIG. 1A is a plan view, and FIGS. 1B to 1D are cross-sectional views, illustrating a method of manufacturing a semiconductor device, according to some example embodiments of the present inventive concepts;

FIG. 2A is a plan view, and FIGS. 2B to 2D are cross-sectional views, illustrating a method of manufacturing a semiconductor device, according to some example embodiments of the present inventive concepts;

FIG. 3A is a plan view, and FIGS. 3B to 3D are cross-sectional views, illustrating a method of manufacturing a semiconductor device, according to some example embodiments of the present inventive concepts;

FIG. 4A is a plan view, and FIGS. 4B to 4D are cross-sectional views, illustrating a method of manufacturing a semiconductor device, according to some example embodiments of the present inventive concepts;

FIG. 5A is a plan view, and FIGS. 5B to 5D are cross-sectional views, illustrating a method of manufacturing a semiconductor device, according to some example embodiments of the present inventive concepts.

DETAILED DESCRIPTION

Figure 1A:
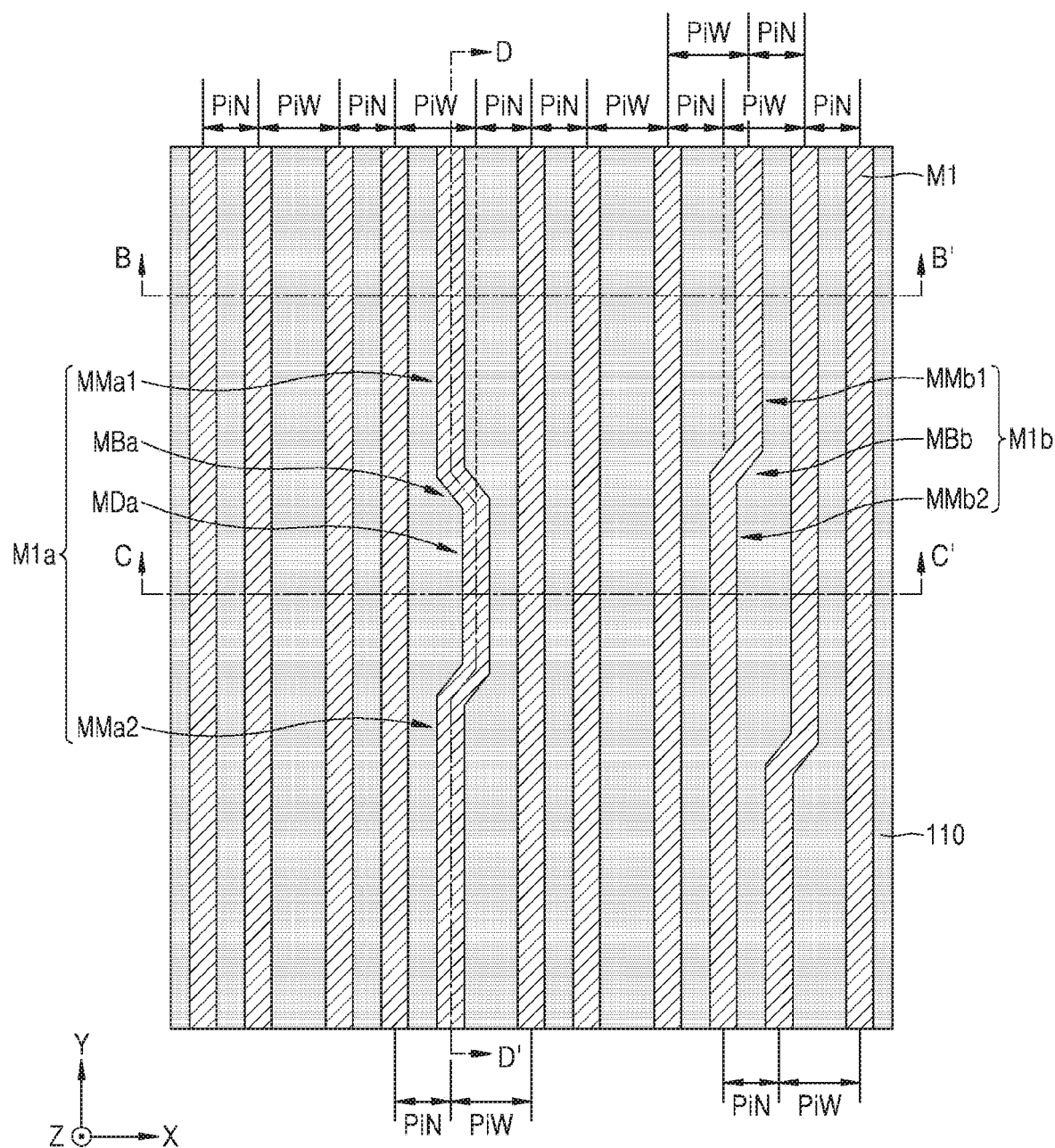
Figure 1B:
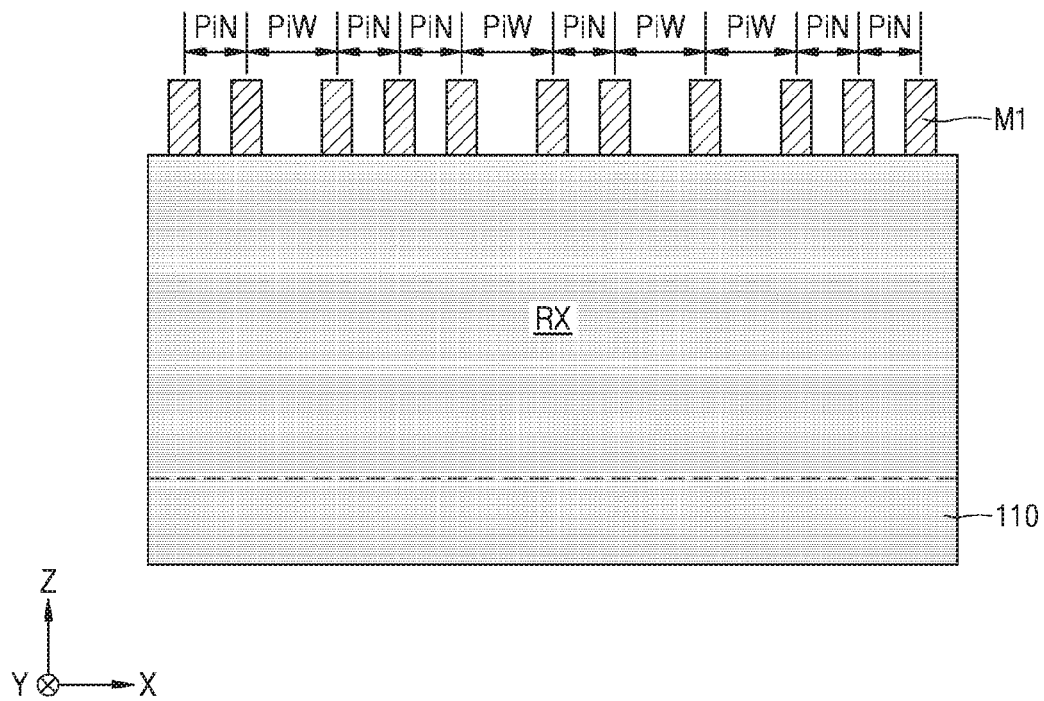
Figure 1C:
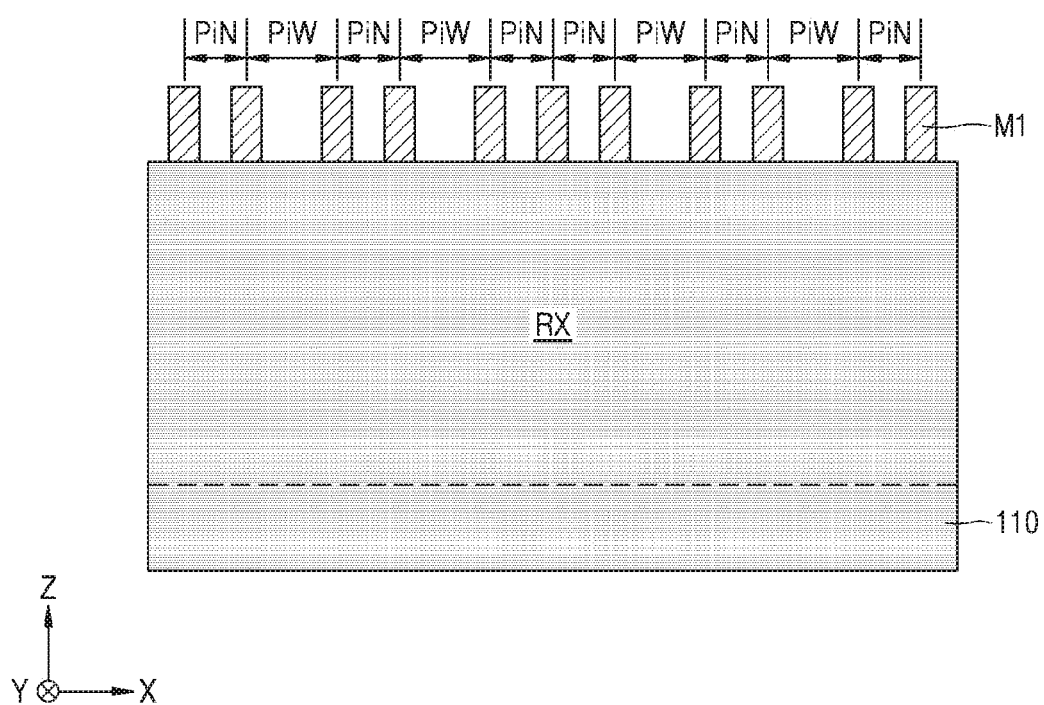
Figure 1D:
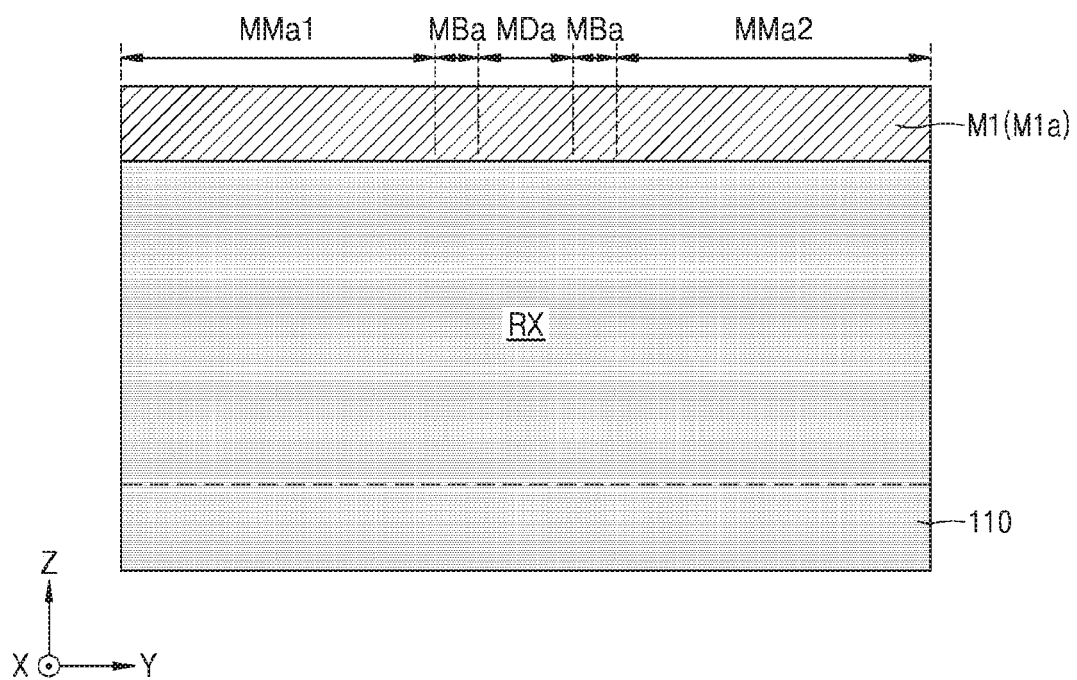

FIGS. 1A to 1D are a plan view and cross-sectional views illustrating a method of manufacturing a semiconductor device, according to some example embodiments of the present inventive concepts. In more detail, FIG. 1A is a plan view and FIGS. 1B, 1C, and 1D are respective cross-sectional views taken along line B-B', line C-C', and line D-D' of FIG. 1A.

Referring to FIGS. 1A to 1D, a plurality of first mask patterns M1 are formed on a substrate 110 having a device region RX. The device region RX may be an upper portion of the substrate 110.

The substrate 110 may include a semiconductor material. The substrate 110 may include at least one of a group III-V material and a group IV material. The substrate 110 may include, for example, silicon (Si). Alternatively, the substrate 110 may include a semiconductor element such as germanium (Ge), or a compound semiconductor material such as silicon germanium (SiGe), silicon carbide (SiC), gallium arsenide (GaAs), indium arsenide (InAs), and indium phosphide (InP). The group III-V material may include a binary, a trinary, or a quaternary compound including at least one group III element and at least one group V element. The group III-V material may be a compound including at least one element of indium (In), gallium (Ga), and aluminum (Al), as the group III element, and at least one element of arsenic (As), phosphorus (P), and antimony (Sb), as the group V element. For example, the group III-V material may be selected from InP, $In_zGa_{1-z}As$ (0≤z≤1), and $Al_zGa_{1-z}As$ (0≤z≤1). The binary compound may be one of, for example, InP, GaAs, InAs, InSb and GaSb. The trinary compound may be one of InGaP, InGaAs, AlInAs, InGaSb, GaAsSb and GaAsP. The group IV material may be Si or Ge. However, example embodiments of the present inventive concepts are not limited to the above examples of the group III-V material and the group IV material usable in a semiconductor device. The group III-V material and the group IV material such as Ge may be used as channel materials for forming a transistor having low power consumption and a high operating speed. A high performance CMOS device may be fabricated by using a semiconductor substrate including the group III-V material, e.g., GaAs, having a higher electron mobility than that of an Si substrate, and a semiconductor substrate having a semiconductor material, e.g., Ge, having a higher hole mobility than that of the Si substrate. In some example embodiments, when an n-channel metal-oxide-semiconductor (NMOS) transistor is formed on the substrate 110, the substrate 110 may include one of the group III-V materials explained above. In some example embodiments, when a p-channel metal-oxide-semiconductor (PMOS) transistor is formed on the substrate 110, at least a part of the substrate 110 may include Ge. In some example embodiments, the substrate 110 may have a silicon-on-insulator (SOI) structure or a germanium-on-insulator (GOI) structure. For example, the substrate 110 may include a buried oxide (BOX) layer. The substrate 110 may include a conductive area, for example, a well doped with impurities.

The plurality of first mask patterns M1 are substantially spaced apart from each other in a first direction (X direction) and may extend primarily/substantially (i.e., a longest distance) in a second direction (Y direction). The fact that the plurality of first mask patterns M1 extend substantially in the second direction (Y direction) means that the plurality of first mask patterns M1 extend mostly/entirely in the second direction (Y direction), but at least some of the plurality of first mask patterns M1 may extend partially in a direction different from the second direction (Y direction).

At least some of the plurality of first mask patterns M1 may have portions extending in a direction different from the second direction (Y direction). In the specification, the phrase "first mask patterns M1 extending in the second direction (Y direction)" may mean that all of the plurality of first mask patterns M1 extend in the second direction (Y direction) without some of them extending in a direction different from the second direction. In the specification, curved mask patterns M1a and M1b have a portion extending in a direction different from the second direction (Y direction) in the plurality of first mask patterns M1. In particular, the curved mask patterns M1a and M1b may change directions. The curved mask patterns M1a and M1b may include a first curved mask pattern M1a and a second curved mask pattern M1b.

The first curved mask pattern M1a may include a first main extension unit/portion MMa1, a second main extension unit/portion MMa2, a mask bypass extension unit/portion MDa, and first mask refraction units/portions MBa. The first main extension unit/portion MMa1, one of the first mask refraction units/portions MBa, the mask bypass extension unit/portion MDa, the other (a second) one of the first mask refraction units/portions MBa, and the second main extension unit/portion MMa2 may be sequentially connected to provide the first curved mask pattern M1a and may extend substantially in the second direction (Y direction).

The first main extension unit/portion MMa1, the second main extension unit/portion MMa2, and the mask bypass extension unit/portion MDa may all extend primarily in the second direction (Y direction) and may be spaced apart from each other. The first main extension unit/portion MMa1 and the second main extension unit/portion MMa2 are located on one straight line extending in the second direction (Y direction) and may be spaced apart from each other. As the first main extension unit/portion MMa1 and the second main extension unit/portion MMa2 are located on the same straight line, they may be referred to herein as being "collinear."

The mask bypass extension MDa may be on another (a second) straight line which is spaced apart from the one straight line and extends in the second direction, the one straight line extending in the second direction (Y direction) and the first main extension unit/portion MMa1 and the second main extension unit/portion MMa2 being located on the one straight line.

The first mask refraction units/portions MBa are located between the first main extension unit/portion MMa1 and the mask bypass extension unit/portion MDa and between the second main extension unit/portion MMa2 and the mask bypass extension unit/portion MDa, and may connect the first main extension unit/portion MMa1 and the mask bypass extension unit/portion MDa, and the second main extension unit/portion MMa2 and the mask bypass extension unit/portion MDa, respectively.

The first mask refraction units/portions MBa may extend primarily in a direction different from the second direction (Y direction). The first mask refraction units/portions MBa may extend, e.g., in an oblique direction with respect to each of the first direction (X direction) and the second direction (Y direction) as shown in FIG. 1A, but are not limited thereto. In some example embodiments, the first mask refraction units/portions MBa may extend in the first direction (X direction). In some example embodiments, the first mask refraction units/portions MBa may have an S shape.

The second curved mask pattern M1b may include a third main extension unit/portion MMb1, a fourth main extension unit/portion MMb2, and a second mask refraction unit/portion MBb. The third main extension unit/portion MMb1, the second mask refraction unit/portion MBb, and the fourth main extension unit/portion MMb2 may be sequentially connected to provide the second curved mask pattern M1b and may extend substantially in the second direction (Y direction).

The third main extension unit/portion MMb1 and the fourth main extension unit/portion MMb2 may each extend in the second direction (Y direction), and may be spaced apart from each other. The third main extension unit/portion MMb1 and the fourth main extension unit/portion MMb2 are located on respective straight lines extending in the second direction (Y direction) and spaced apart from each other, wherein the third main extension unit/portion MMb1 and the fourth main extension unit/portion MMb2 may be spaced apart from each other.

The second mask refraction unit/portion MBb is located between the third main extension unit/portion MMb1 and the fourth main extension unit/portion MMb2 and may connect the same.

The second mask refraction unit/portion MBb may extend in a direction different from the second direction (Y direction). The second mask refraction unit/portion MBb may extend, e.g., in an oblique direction with respect to each of the first direction (X direction) and the second direction (Y direction) as shown in FIG. 1A, but is not limited thereto. In some example embodiments, the second mask refraction unit/portion MBb may extend in the first direction (X direction). In some example embodiments, the second mask refraction unit/portion MBb may have an S shape.

In some example embodiments, the second curved mask pattern M1b may be a portion of the first curved mask pattern M1a. That is, the third main extension unit/portion MMb1, the fourth main extension unit/portion MMb2, and the second mask refraction unit/portion MBb of the second curved mask pattern M1b may correspond to the first main extension unit/portion MMa1, the mask bypass extension unit/portion MDa, and the first mask refraction units/portions MBa connecting the first main extension unit/portion MMa1 and the mask bypass extension unit/portion MDa of the first curved mask pattern M1a, respectively.

Furthermore, FIG. 1A shows that the first curved mask pattern M1a has two of the main extension units/portions MMa1 and MMa2, one of the mask bypass extension units/portion MDa, and two of the mask refraction units/portions MBa, but is not limited thereto. The first curved mask pattern M1a may have three or more main extension units/portions, and two or more mask bypass extension units/portions, and may further have three or more mask refraction units/portions for connecting the main extension units/portions and the mask bypass extension units/portions.

Similarly, FIG. 1A shows that the second curved mask pattern M1b has two of the main extension units/portions MMb1 and MMb2, and one of the mask refraction unit/portion MBb, but is not limited thereto. The second curved mask pattern M1b may have three or more main extension units/portions, and one or more mask bypass extension units/portions, and may further have three or more mask refraction units/portions for connecting the main extension units/portions and the mask bypass extension units/portions.

The plurality of first mask patterns M1 may be spaced apart from each other by a first pitch PiN or a second pitch PiW and may extend in a direction. In the specification, a pitch refers to an interval of the first mask patterns M1, or structures being spaced apart from each other and extending in a direction, such as a fin-shaped active region and a protruding pattern described later below, and in more detail, a distance between centers of the two structures spaced apart and extending from each other in a width direction.

The second pitch PiW may have a value larger than the first pitch PiN. In some example embodiments, the second pitch PiW may be 1.5 times the first pitch PiN, but is not limited thereto.

A difference between the second pitch PiW and the first pitch PiN may be an interval/distance between one straight line (e.g., an axis) extending in the second direction (Y direction) and at which the first main extension unit/portion MMa1 and the second main extension unit/portion MMa2 are located (e.g., at respective midpoints of the units/portions MMa1 and MMa2) and another straight line (e.g., another axis) extending in the second direction (Y direction) and at which the mask bypass extension unit/portion MDa is located. In some example embodiments, the interval/distance between one straight line extending in the second direction (Y direction) and at which the first main extension unit/portion MMa1 and the second main extension unit/portion MMa2 are located and the other straight line extending in the second direction (Y direction) and at which the mask bypass extension unit/portion MDa is located may be 0.5 times the first pitch PiN.

The difference between the second pitch PiW and the first pitch PiN may be an interval/distance between straight lines extending in the second direction (Y direction) and at which the third main extension unit/portion MMb1 and the fourth main extension unit/portion MMb2 are located, respectively. In some example embodiments, the interval/distance between straight lines extending in the second direction (Y direction) and at which the third main extension unit/portion MMb1 and the fourth main extension unit/portion MMb2 are located, respectively, may be 0.5 times the first pitch PiN.

As will be described later below in detail in FIGS. 3A to 3D, portions of the first mask pattern M1 corresponding to a remaining portion and a removed portion after performing a subsequent process from among structures (preliminary fin-shaped active regions PFA in FIGS. 2A to 2D), which are formed by performing an etching process using the first mask pattern M1 as an etching mask, may be spaced apart from each other with the second pitch PiW. In addition, portions of the first mask pattern M1 corresponding to two remaining portions or two removed portions after performing the subsequent process from among the structures (preliminary fin-shaped active regions PFA in FIGS. 2A to 2D), which are formed by performing the etching process using the first mask pattern M1 as an etching mask, may be spaced apart from each other with the first pitch PiN.

The first mask pattern M1 may include a silicon nitride layer, a silicon oxynitride layer, a spin-on glass (SOG) layer, a spin-on hardmask (SOH) layer, a photoresist layer, or a combination thereof, but is not limited thereto.

In some example embodiments, the first mask pattern M1 may be formed by an extreme ultraviolet lithography (EUV) process.

Figure 2B:
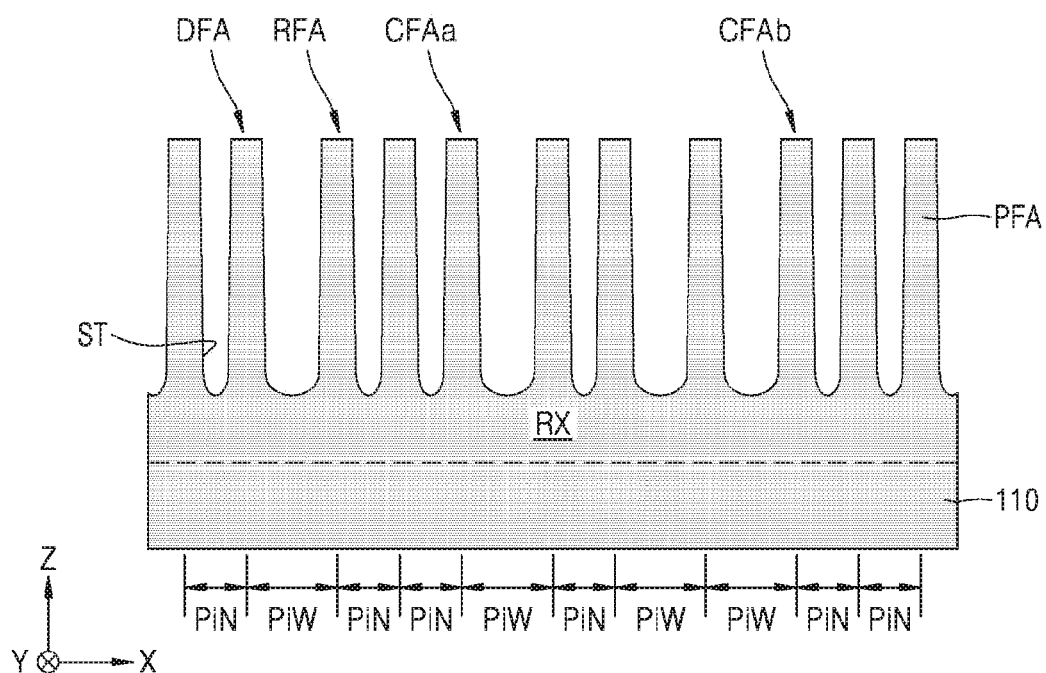
Figure 2C:
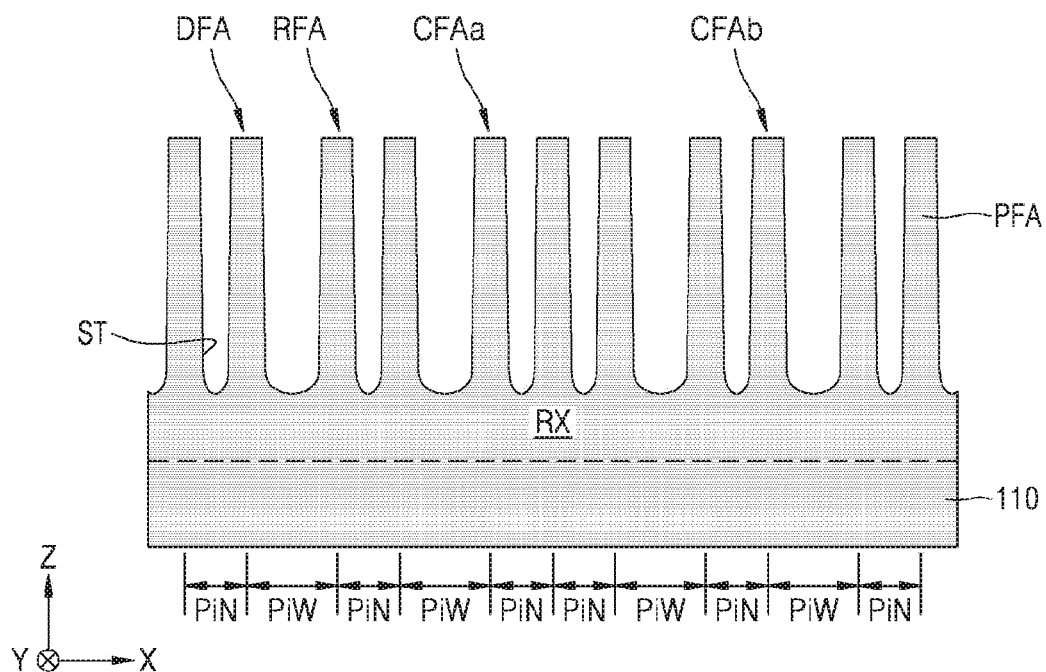
Figure 2D:
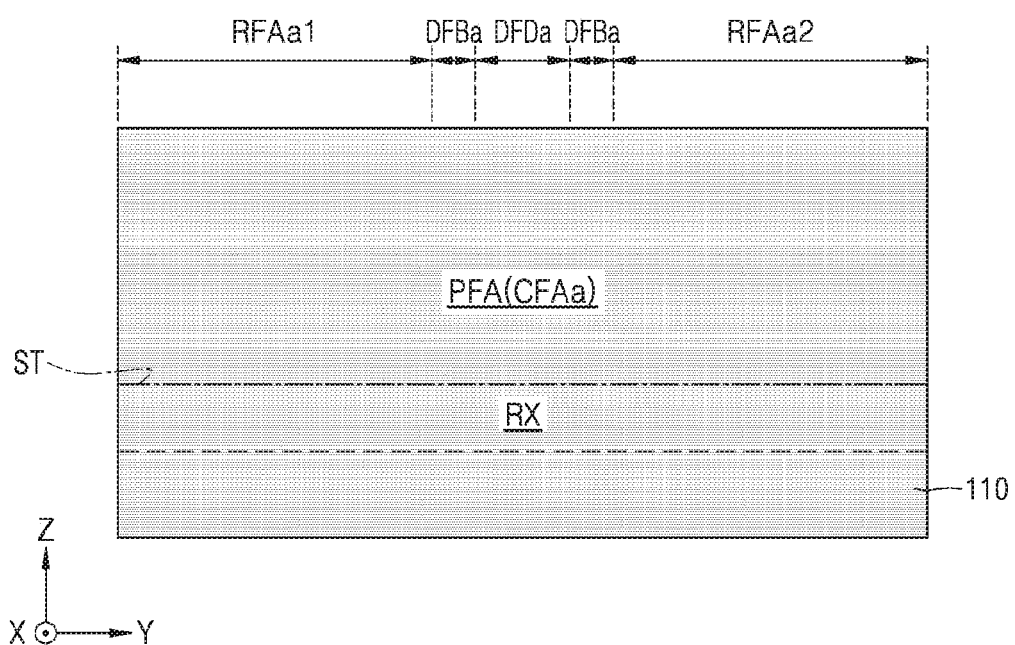

FIGS. 2A to 2D are a plan view and cross-sectional views illustrating a method of manufacturing a semiconductor device, according to some example embodiments of the present inventive concepts. In more detail, FIGS. 2B, 2C, and 2D are respective cross-sectional views taken along line B-B', line C-C', and line D-D' of FIG. 2A which is a plan view.

Referring to FIGS. 2A to 2D together, a portion of the substrate 110 is etched using the first mask pattern M1 (of FIGS. 1A to 1D) as an etch mask to form a shallow trench ST, and the plurality of preliminary fin-shaped active regions PFA spaced apart from each other with the shallow trench ST therebetween are formed. In some example embodiments, a portion of the first mask pattern M1 may remain on an upper surface of the preliminary fin-shaped active regions PFA. The plurality of preliminary fin-shaped active regions PFA may be spaced apart from each other by the first pitch PiN or the second pitch PiW. Since an arrangement of the plurality of preliminary fin-shaped active regions PFA is substantially the same as that of the plurality of first mask patterns M1, a detailed description thereof will not be given herein.

The preliminary fin-shaped active regions PFA may have a shape protruding in a third direction (Z direction) from the device region RX of the substrate 110. In some example embodiments, the preliminary fin-shaped active regions PFA may have a shape in which a width of an upper portion is slightly tapered relative to a width of a lower portion.

The plurality of preliminary fin-shaped active regions PFA may include a real fin-shaped active region RFA, a dummy fin-shaped active region DFA, a first curved fin-shaped active region CFAa, and a second curved fin-shaped active region CFAb.

The real fin-shaped active region RFA and the dummy fin-shaped active region DFA may correspond to the first mask pattern M1 in which all of the portions of the plurality of preliminary fin-shaped active regions PFA described in FIGS. 1A to 1D extend in the second direction (Y direction). An upper surface of the real fin-shaped active region RFA may be covered by a second mask pattern M2 described later below with reference to FIGS. 3A to 3D and an upper surface of the dummy fin-shaped active region DFA may not be covered by the second mask pattern M2.

The first curved fin-shaped active region CFAa and the second curved fin-shaped active region CFAb may correspond to the first curve mask pattern M1a (of FIG. 1A) and the second curve mask pattern M1b (of FIG. 1A), respectively.

The first curved fin-shaped active region CFAa may include a first real fin-shaped extension unit/portion RFAa1, a second real fin-shaped extension unit/portion RFAa2, a dummy fin-shaped bypass extension unit/portion DFDa, and a first fin-shaped refraction unit/portion DFBa. The first real fin-shaped extension unit/portion RFAa1, the second real fin-shaped extension unit/portion RFAa2, the dummy fin-shaped bypass extension unit/portion DFDa, and the first fin-shaped refraction unit/portion DFBa may correspond to the first main extension unit/portion MMa1 (of FIG. 1A), the second main extension unit/portion MMa2 (of FIG. 1A), the mask bypass extension unit/portion MDa (of FIG. 1A), and the first mask refraction units/portions MBa (of FIG. 1A) in the first curved fin-shaped active region CFAa, respectively.

An upper surface of the first real fin-shaped extension unit/portion RFAa1 and the second real fin-shaped extension unit/portion RFAa2 in the first curved fin-shaped active region CFAa may be covered by the second mask pattern M2 described later below with reference to FIGS. 3A to 3D and an upper surface of the dummy fin-shaped bypass extension unit/portion DFDa and the first fin-shaped refraction unit/portion DFBa may not be covered by the second mask pattern M2.

The second curved fin-shaped active region CFAb may include a third real fin-shaped extension unit/portion RFAb, a dummy fin-shaped extension unit/portion DFAb, and a second fin-shaped refraction unit/portion DFBb. The third real fin-shaped extension RFAb, the dummy fin-shaped extension DFAb, and the second fin-shaped refraction unit/portion DFBb may correspond to the third main extension unit/portion MMb1 (of FIG. 1A), the fourth main extension unit/portion MMb2 (of FIG. 1A), and the second mask refraction unit/portion MBb (of FIG. 1A) in the second curved fin-shaped active region CFAb, respectively.

An upper surface of the third real fin-shaped extension unit/portion RFAb in the second curved fin-shaped active region CFAb may be covered by the second mask pattern M2 described later below with reference to FIGS. 3A to 3D and an upper surface of the dummy fin-shaped extension unit/portion DFAb and the second fin-shaped refraction unit/portion DFBb may not be covered by the second mask pattern M2.

Figure 3A:
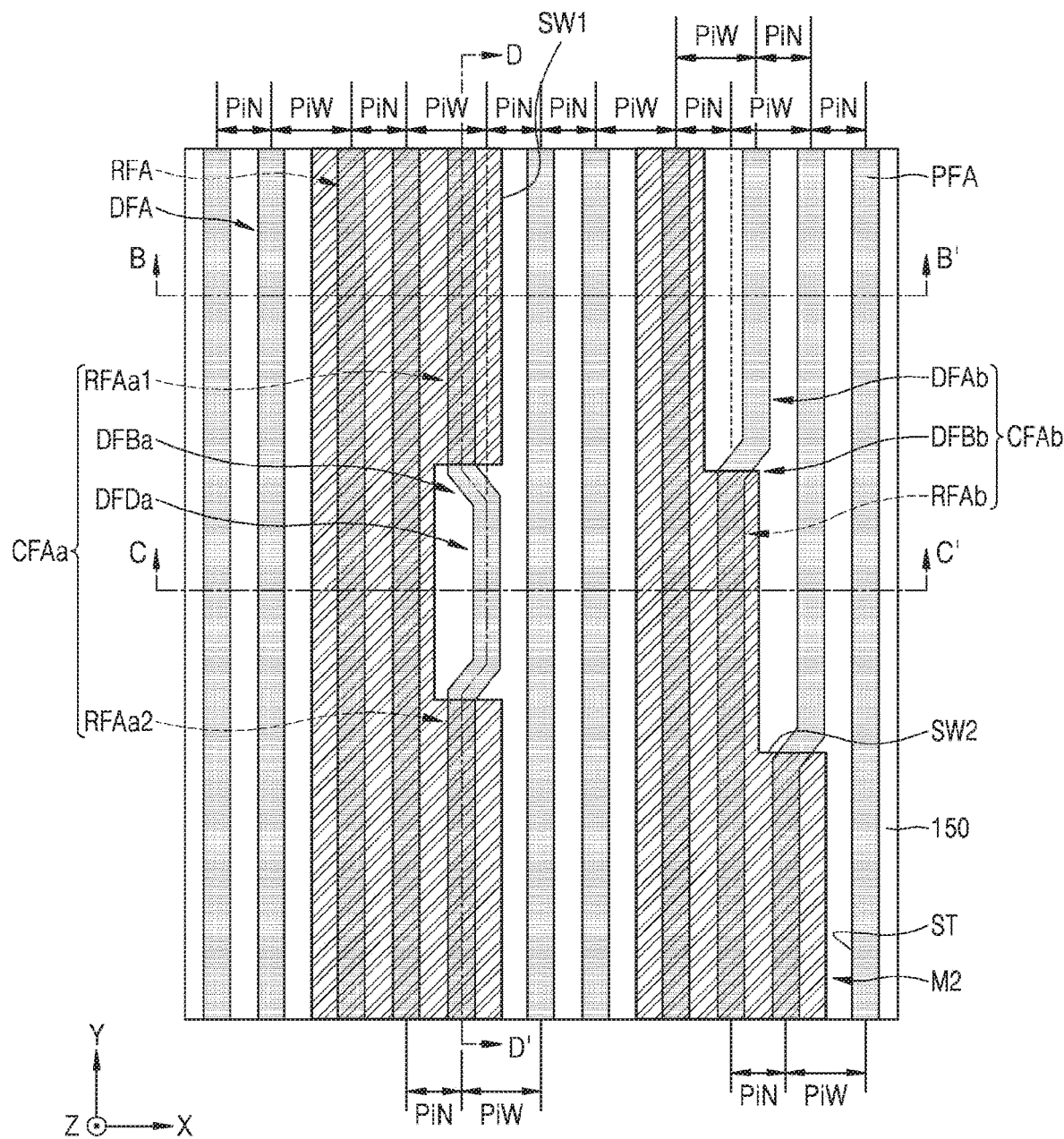
Figure 3B:
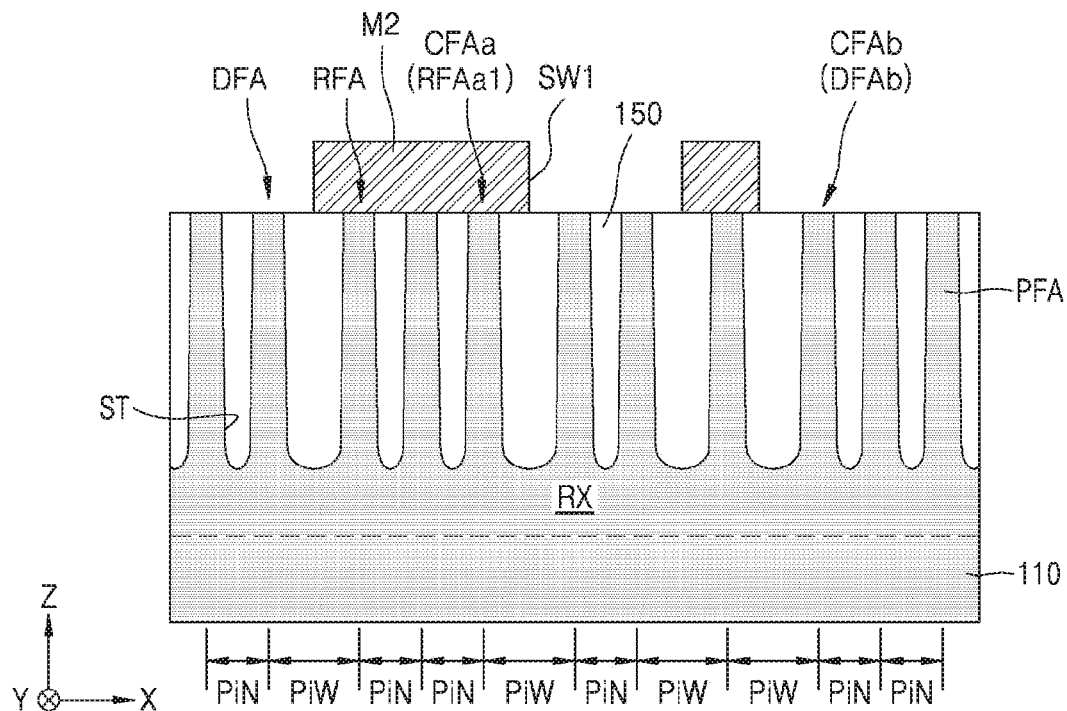
Figure 3C:
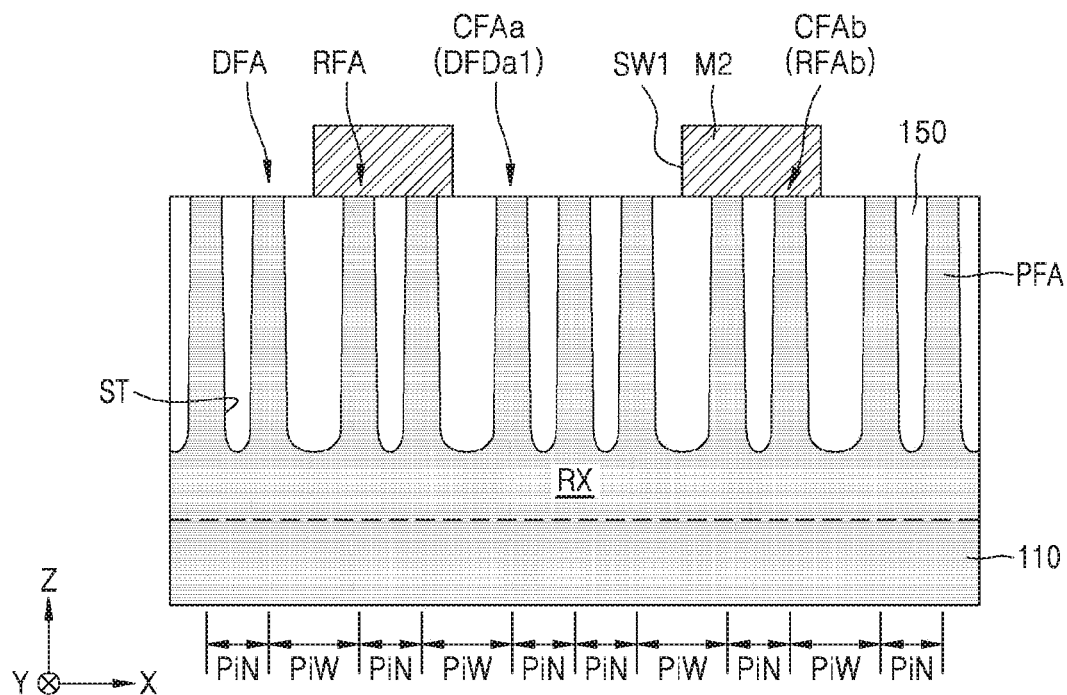
Figure 3D:
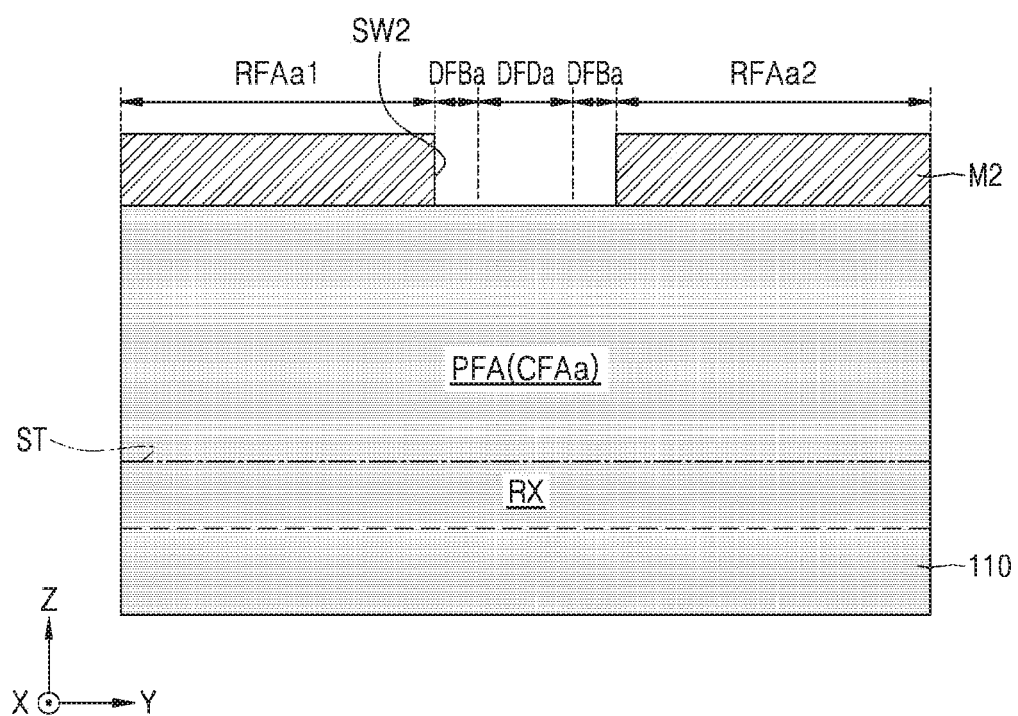

FIGS. 3A to 3D are a plan view and cross-sectional views illustrating a method of manufacturing a semiconductor device, according to some example embodiments of the present inventive concepts. In more detail, FIGS. 3B, 3C, and 3D are respective cross-sectional views taken along line B-B', line C-C', and line D-D' of FIG. 3A which is a plan view.

Referring to FIG. 3A, after a mold layer 150 filling the shallow trench ST is formed, the second mask pattern M2 is formed on the mold layer 150. In some example embodiments, the mold layer 150 may fill the shallow trench ST and cover the upper surface of the preliminary fin-shaped active regions PFA. The second mask pattern M2 may include a silicon nitride layer, a silicon oxynitride layer, an SOG layer, an SOH layer, a photoresist layer, or a combination thereof, but is not limited thereto.

The second mask pattern M2 may be on (e.g., may cover) an upper surface of a first portion of the preliminary fin-shaped active regions PFA and may not cover an upper surface of a remaining/second portion of the preliminary fin-shaped active regions PFA.

As described with reference to FIGS. 2A to 2D, the second mask pattern M2 may be formed to overlap the real fin-shaped active region RFA, the first real fin-shaped extension unit/portion RFAa1, the second real fin-shaped extension unit/portion RFAa2, and the third real fin-shaped extension unit/portion RFAb in the third direction (Z direction) so as to cover the upper surface of the real fin-shaped active region RFA, the first real fin-shaped extension unit/portion RFAa1, the second real fin-shaped extension unit/portion RFAa2, and the third real fin-shaped extension unit/portion RFAb.

The second mask pattern M2 may be formed not to overlap the dummy fin-shaped active region DFA, the dummy fin-shaped bypass extension unit/portion DFDa, the first fin-shaped refraction unit/portion DFBa, the dummy fin-shaped extension unit/portion DFAb, and the second fin-shaped refraction unit/portion DFBb in the third direction (Z direction) so as not to cover the upper surface of the dummy fin-shaped active region DFA, the dummy fin-shaped bypass extension unit/portion DFDa, the first fin-shaped refraction unit/portion DFBa, the dummy fin-shaped extension unit/portion DFAb, and the second fin-shaped refraction unit/portion DFBb.

That is, portions of the preliminary fin-shaped active regions PFA covered by the second mask pattern M2 are referred to as the real fin-shaped active region RFA, the first real fin-shaped extension unit/portion RFAa1, the second real fin-shaped extension unit/portion RFAa2, and the third real fin-shaped extension unit/portion RFAb. Portions of the preliminary fin-shaped active regions PFA not covered by the second mask pattern M2 are referred to as the dummy fin-shaped active region DFA, the dummy fin-shaped bypass extension unit/portion DFDa, the first fin-shaped refraction unit/portion DFBa, the dummy fin-shaped extension unit/portion DFAb, and the second fin-shaped refraction unit/portion DFBb.

In some example embodiments, the second mask pattern M2 may be on (e.g., may cover) a first portion of the first fin-shaped refraction unit/portion DFBa and the second fin-shaped refraction unit/portion DFBb, and may not cover a remaining/second portion of the first fin-shaped refraction unit/portion DFBa and the second fin-shaped refraction unit/portion DFBb.

A first sidewall SW1 from among sidewalls of the second mask pattern M2, which extends in the second direction (Y direction) and faces the first direction (X direction), may be on the shallow trench ST between two adjacent preliminary fin-shaped active regions PFA. A second sidewall SW2 from among sidewalls of the second mask pattern M2, which extends in the first direction (X direction) and faces the second direction (Y direction), may be located to traverse at least one of the preliminary fin-shaped active regions PFA.

An interval of the two adjacent preliminary fin-shaped active regions PFA with the first sidewall SW1 of the second mask pattern M2 therebetween may be the second pitch PiW. When the second mask pattern M2 covers or does not cover the entire shallow trench ST between the two adjacent preliminary fin-shaped active regions PFA, an interval between the two adjacent preliminary fin-shaped active regions PFA without the first sidewall SW1 of the second mask pattern M2 therebetween may be equal to the first pitch PiN. That is, the second pitch PiW, which is the interval of the two adjacent preliminary fin-shaped active regions PFA with the first sidewall SW1 of the second mask pattern M2 therebetween, may have a value larger than the first pitch PiN, which is the interval of the two adjacent preliminary fin-shaped active regions PFA without the first sidewall SW1 of the second mask pattern M2 therebetween.

Accordingly, when a portion of the plurality of preliminary fin-shaped active regions PFA is etched and removed by using the second mask pattern M2 as an etching mask, the interval of the two adjacent preliminary fin-shaped active regions PFA with the first sidewall SW1 of the second mask pattern M2 therebetween has the second pitch PiW, which is a relatively large value. Therefore, it may be possible to secure a sufficient etching process margin which can inhibit/prevent a portion of the preliminary fin-shaped active regions PFA, which is desired not to be removed, from being removed, or a portion of the preliminary fin-shaped active regions PFA, which is desired to be removed, from remaining.

Figure 4A:
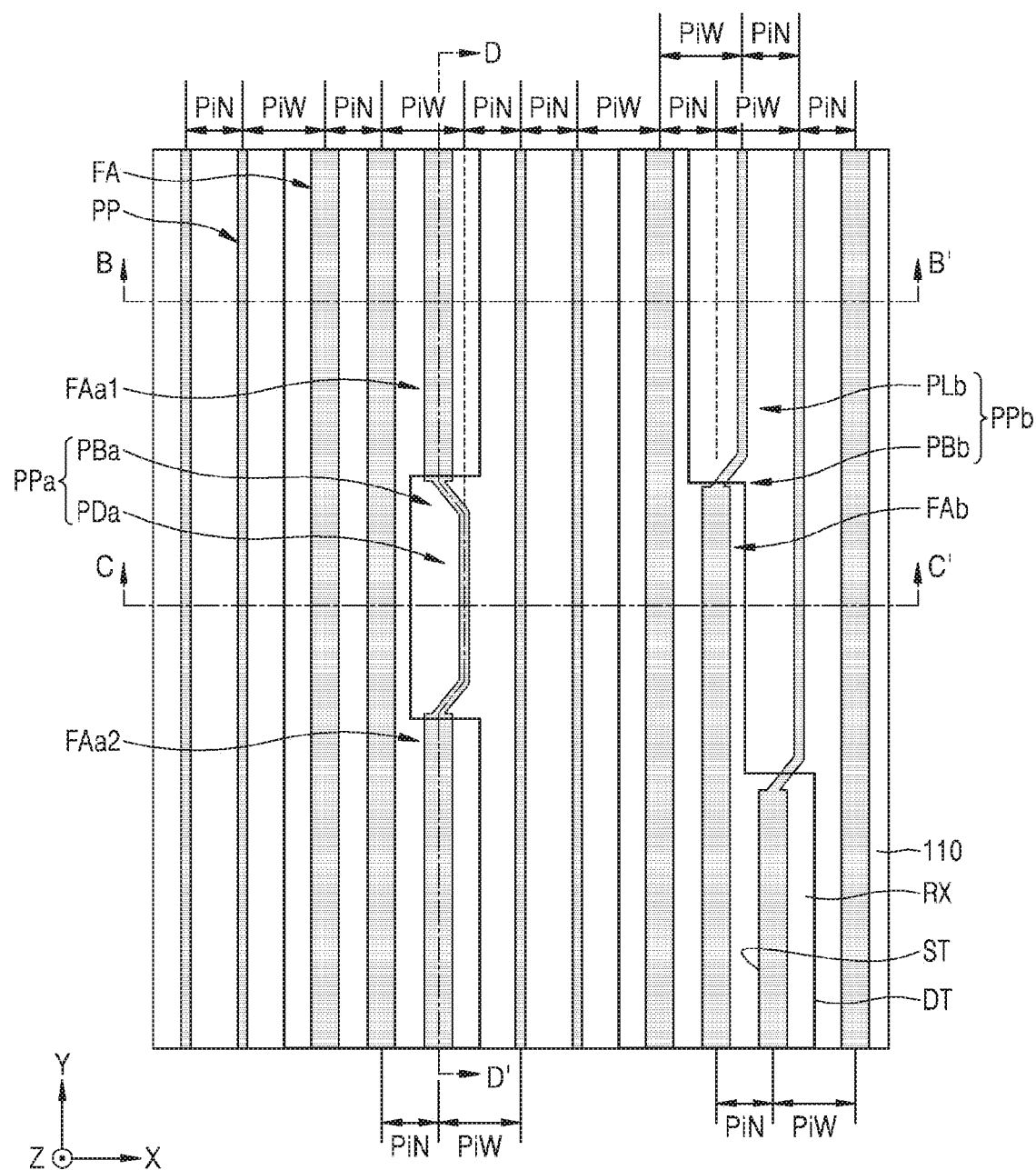
Figure 4B:
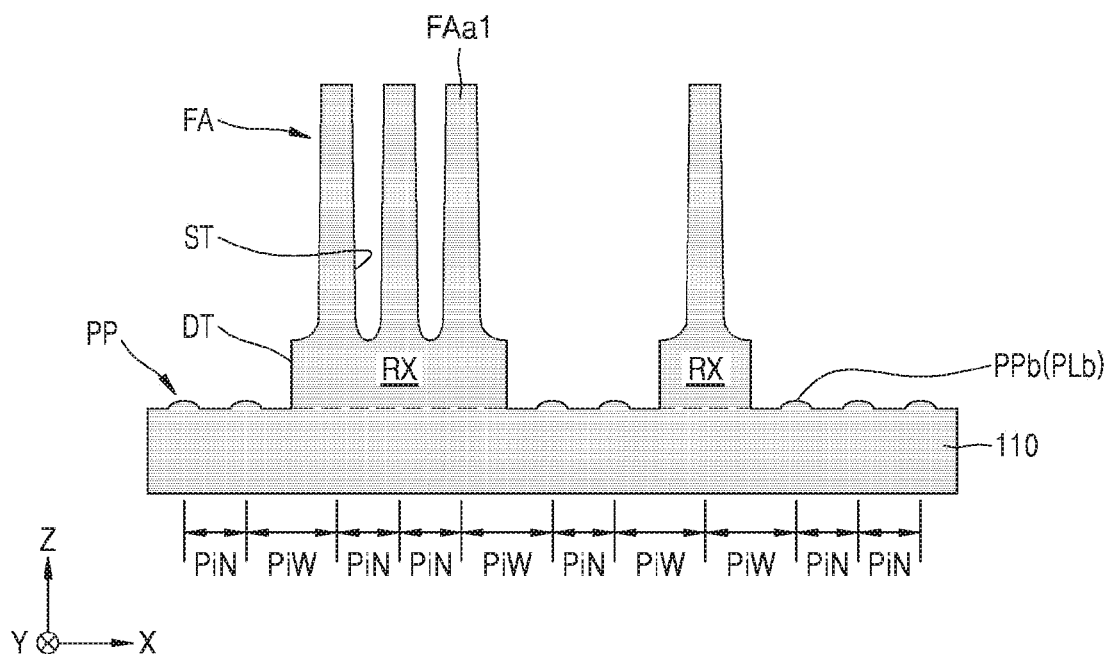
Figure 4C:
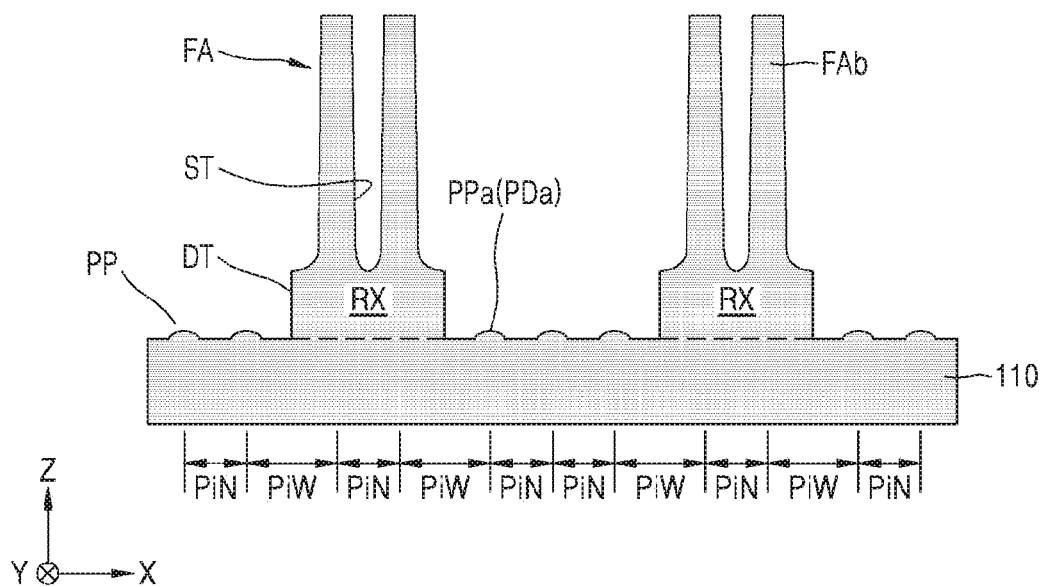
Figure 4D:
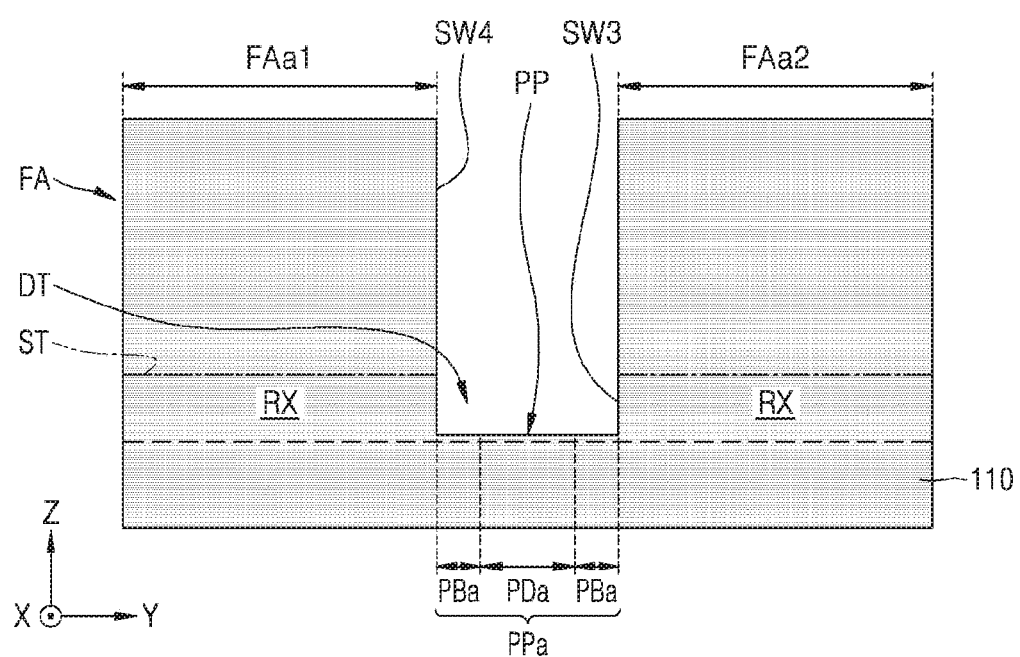

FIGS. 4A to 4D are a plan view and cross-sectional views illustrating a method of manufacturing a semiconductor device, according to some example embodiments of the present inventive concepts. In more detail, FIGS. 4B, 4C, and 4D are respective cross-sectional views taken along line B-B', line C-C', and line D-D' of FIG. 4A which is a plan view.

Referring to FIGS. 4A to 4D together, a portion of the plurality of preliminary fin-shaped active regions PFA (of FIGS. 3A to 3D) and a portion of the device region RX are removed by using the second mask pattern M2 (of FIGS. 3A to 3D) as an etching mask to form a deep trench DT for separating a fin-shaped active region FA and the device region RX. Thereafter, the mold layer 150 (of FIGS. 3A to 3D) may be removed. In some example embodiments, a portion of the mold layer 150 may remain to be a portion or all of a first isolation layer 122 described in FIGS. 5A to 5D later below.

The device region RX may be a portion protruding from a lower surface of the deep trench DT of the substrate 110. Thus, a plurality of device regions RX may be spaced apart from each other with the deep trench DT therebetween. A portion of the substrate 110 other than the device regions RX, that is, a lower portion with respect to the lower surface of the deep trench DT, may be referred to as a substrate base portion. Thus, the substrate 110 may include the substrate base portion and the plurality of device regions RX that are arranged on the substrate base portion and spaced apart from each other.

Referring to FIGS. 4A to 4D together with FIGS. 3A to 3D, a portion of the preliminary fin-shaped active regions PFA covered by the second mask pattern M2 may be the fin-shaped active region FA. In more detail, the first real fin-shaped extension unit/portion RFAa1, the second real fin-shaped extension unit/portion RFAa2, and the third real fin-shaped extension unit/portion RFAb may be a first fin-shaped extension unit/portion FAa1, a second fin-shaped extension unit/portion FAa2, and a third fin-shaped extension unit/portion FAb, respectively. Also, the real fin-shaped active region RFA may be the fin-shaped active region FA "extending in the second direction (Y direction)". The fin-shaped active region FA "extending in the second direction (Y direction)" from among the fin-shaped active regions FA may be referred to as a straight fin-shaped active region.

A portion of the preliminary fin-shaped active regions PFA that is not covered by the second mask pattern M2 may be mostly removed and a part thereof may remain on the substrate 110 to be a protruding pattern PP. In more detail, the dummy fin-shaped bypass extension unit/portion DFDa, the first fin-shaped refraction unit/portion DFBa, the dummy fin-shaped extension unit/portion DFAb, and the second fin-shaped refraction unit/portion DFBb may be a protruding bypass extension unit/portion PDa, a first protruding refraction unit/portion PBa, a protruding extension unit/portion PLb, and a second protruding refraction pattern PBb, respectively. Also, the dummy fin-shaped active region DFA may be the protruding pattern PP "extending in the second direction (Y direction)". The protruding pattern PP "extending in the second direction (Y direction)" from among a plurality of protruding patterns PP may be referred to as a straight protruding pattern.

The first fin-shaped extension unit/portion FAa1 and the second fin-shaped extension unit/portion FAa2 are located on one straight line (i.e., are collinear) extending in the second direction (Y direction) and may be spaced apart from each other. The protruding bypass extension unit/portion PDa and the first protruding refraction unit/portion PBa between the first fin-shaped extension unit/portion FAa1 and the second fin-shaped extension unit/portion FAa2 may be collectively referred to as a first curved protruding pattern PPa, and a second protruding refraction unit/portion PBb and the protruding extension unit/portion PLb adjacent to the third fin-shaped extension unit/portion FAb may be collectively referred to as the second curved protruding pattern PPb. One of first protruding refraction units/portions PBa, the protruding bypass extension unit/portion PDa, and the other first protruding refraction unit/portion PBa may be sequentially connected to provide the first curved protruding pattern PPa. The second protruding refraction unit/portion PBb and the protruding extension unit/portion PLb may be sequentially connected to provide the second curved protruding pattern PPb.

Referring again to FIGS. 4A and 4B together, portions of fin-shaped active regions FA adjacent to each other in the first direction (X direction) may have an interval of the second pitch PiW in the device region RX, and portions of the protruding patterns PP adjacent to each other in the first direction (X direction) may have an interval of the second pitch PiW in the device region RX. Further, portions of two fin-shaped active regions FA adjacent to each other in the first direction (X direction) may have an interval of the first pitch PiN. Portions of two protruding patterns PP adjacent to each other in the first direction (X direction) may have an interval of the first pitch PiN. As used herein, the term "pitch" refers to a distance between a point on one element and the corresponding point on an adjacent element. For example, the first pitch PiN may be a distance between the midpoint of a first fin-shaped active region FA and the midpoint of an adjacent (i.e., nearest) second fin-shaped active region FA. As another example, the second pitch PiW may be a distance between the midpoint of a fin-shaped active region FA and the midpoint of an adjacent (i.e., nearest) protruding pattern PP.

The third fin-shaped extension unit/portion FAb may have the intervals between the first pitch PiN and a portion of the fin-shaped active regions FA and between the second pitch PiW and another portion of the fin-shaped active regions FA, the portions of the fin-shaped active regions FA respectively being adjacent to both sides of the third fin-shaped extension unit/portion FAb. In more detail, the third fin-shaped extension unit/portion FAb may have the interval of the second pitch PiW from a portion of the fin-shaped active regions FA arranged in a protruding direction of the second curved protruding pattern PPb connected to the third fin-shaped extension unit/portion FAb on a plane arrangement. The third fin-shaped extension unit/portion FAb may have the interval of the first pitch PiN from a portion of the fin-shaped active regions FA arranged in a direction opposite the protruding direction of the second curved protruding pattern PPb.

In more detail, portions of the fin-shaped active regions FA adjacent to the protruding bypass extension unit/portion PDa and the protruding bypass extension unit/portion PDa may have the interval of the second pitch PiW. Similarly, portions of the fin-shaped active regions FA adjacent to the protruding extension unit/portion PLb and the protruding extension unit/portion PLb may have the interval of the second pitch PiW. Portions of the protruding patterns PP adjacent to the protruding bypass extension unit/portion PDa and the protruding bypass extension unit/portion PDa may have the interval of the first pitch PiN. Similarly, portions of the protruding patterns PP adjacent to the protruding extension unit/portion PLb and the protruding extension unit/portion PLb may have the interval of the first pitch PiN.

In the specification, the connection on a plane arrangement means that the second curved protruding pattern PPb and the third fin-shaped extension unit/portion FAb are arranged as if they are connected and extended to each other on the plane arrangement even though they are not actually connected to each other because positions thereof in a vertical direction, i.e., the third direction (Z direction), are different from each other. Also, even when the second curved protruding pattern PPb and the third fin-shaped extension unit/portion FAb have an interval on the plane arrangement due to process variation occurring in a manufacturing process, they can be considered to be connected to each other on the plane arrangement if they are arranged on a line extending generally in the second direction (Y direction).

The protruding pattern PP may extend along a bottom surface of the deep trench DT from a lower end of a third sidewall SW3 of the device region RX to the other/opposite lower end of the third sidewall SW3 of the device region RX. That is, both ends of the protruding pattern PP may be in contact with lower ends of the third sidewall SW3 of the device region RX, respectively.

One end of the fin-shaped active region FA may have a fourth sidewall SW4 which is a sidewall extending from the third sidewall SW3 of the device region RX. The one end of the fin-shaped active region FA may be located on the lower end of the third sidewall SW3 of the device region RX where one end of the protruding pattern PP contacts.

The protruding pattern PP may extend along the bottom surface of the deep trench DT from the fourth sidewall SW4 of the fin-shaped active region FA to the lower end of the third sidewall SW3 of the device region RX.

In some example embodiments, when the third sidewall SW3 of the device region RX and the fourth sidewall SW4 of the fin-shaped active region FA extending therefrom are sloped, as described above, a portion of the protruding pattern PP on a line extending in the second direction (Y direction) and a portion of the fin-shaped active region FA may be separated from each other by a small interval in a plane arrangement.

Each of the third sidewall SW3 and the fourth sidewall SW4 may be a sidewall in the second direction (Y direction) from among the sidewall of the device region RX and the sidewall of the fin-shaped active region FA.

The first curved protruding pattern PPa may extend along the bottom surface of the deep trench DT from the lower end of the third sidewall SW3 of the device region RX, in which the first fin-shaped extension unit/portion FAa1 is arranged, to the other lower end of the third sidewall SW3 of the device region RX, in which the second fin-shaped extended portion FAa2 is arranged, between the first fin-shaped extension unit/portion FAa1 and the second fin-shaped extension unit/portion FAa2. The first curved protruding pattern PPa may have a portion extending in a direction different from the second direction (Y direction). In some example embodiments, the first protruding refraction unit/portion PBa may extend in a direction different from the second direction (Y direction), and the protruding bypass extension unit/portion PDa may extend in the second direction (Y direction).

Both ends of the first curved protruding pattern PPa may be on the lower end of the third sidewall SW3 of the device region RX which is located on one straight line including the first fin-shaped extension unit/portion FAa1 and the second fin-shaped extension unit/portion FAa2 and extending in the second direction (Y direction).

The second curved protruding pattern PPb may extend in the second direction (Y direction) from the lower end of the third sidewall SW3 of the device region RX, in which third fin-shaped extension unit/portion FAb is arranged, to the bottom surface of the deep trench DT.

The second curved protruding pattern PPb may have a portion extending in a direction different from the second direction (Y direction). In some example embodiments, the second protruding refraction unit/portion PBb may extend in a direction different from the second direction (Y direction), and the protruding extension unit/portion PLb may extend in the second direction (Y direction).

Figure 5A:
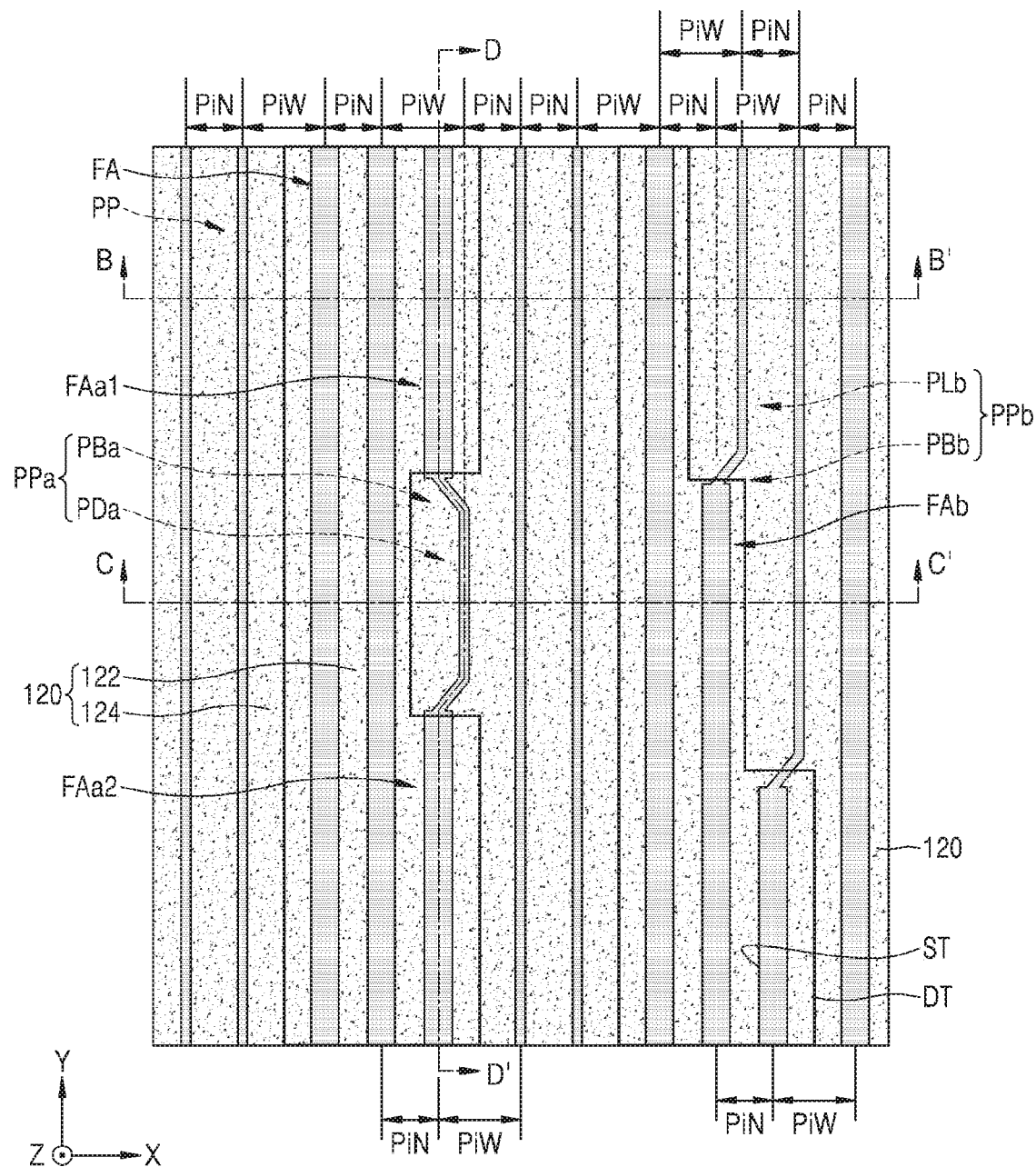
Figure 5B:
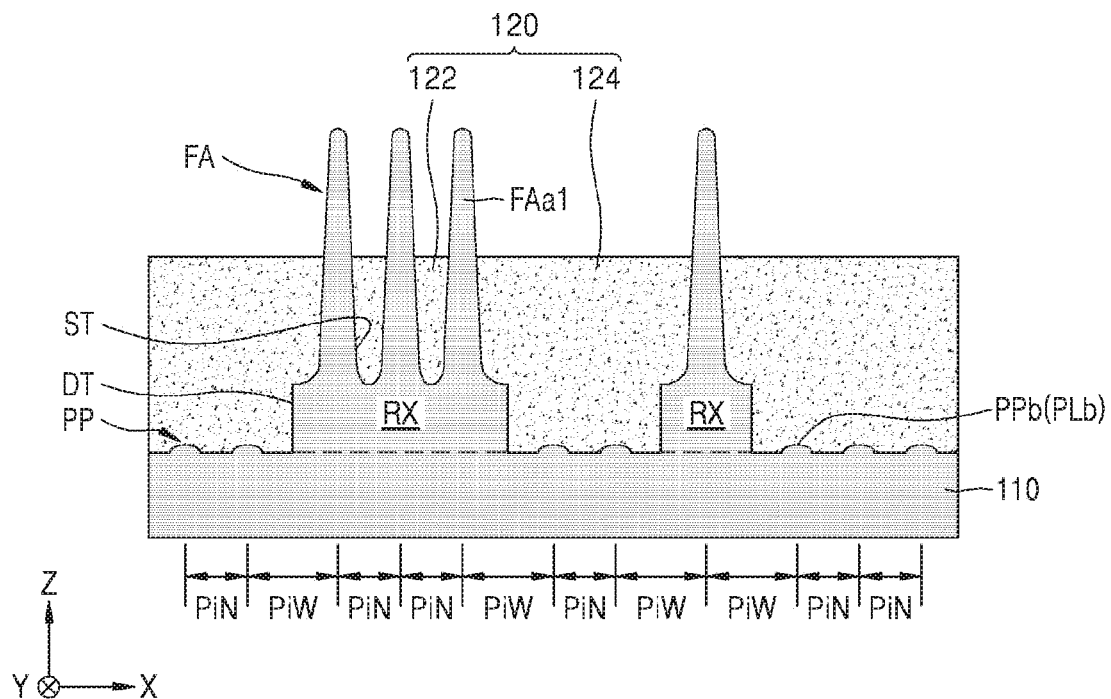
Figure 5C:
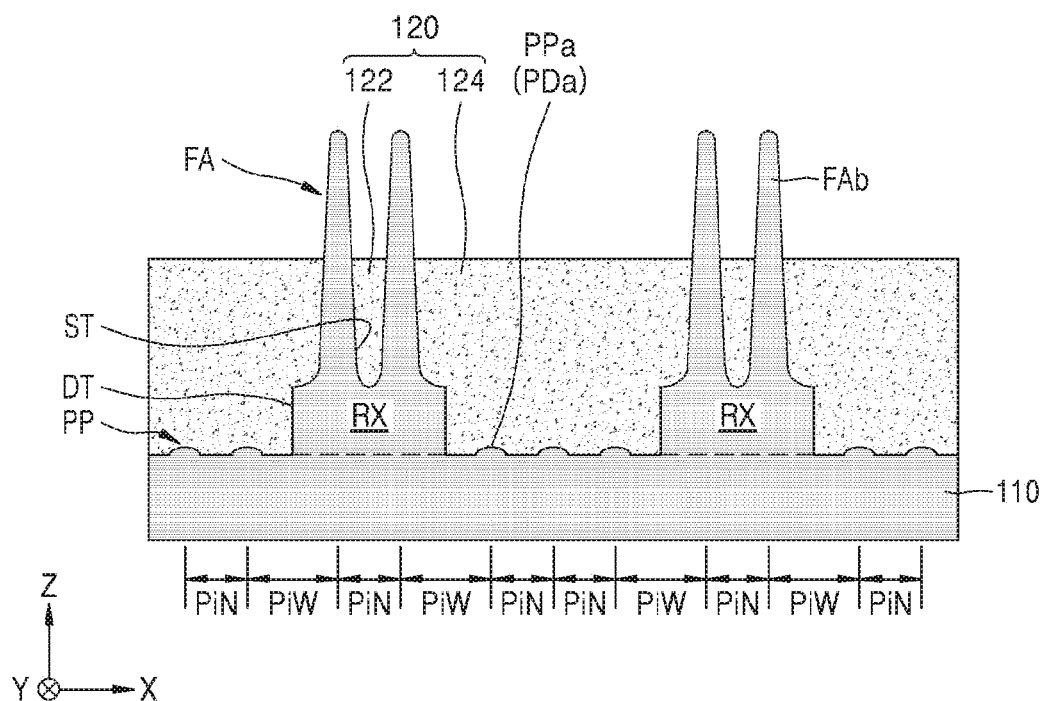
Figure 5D:
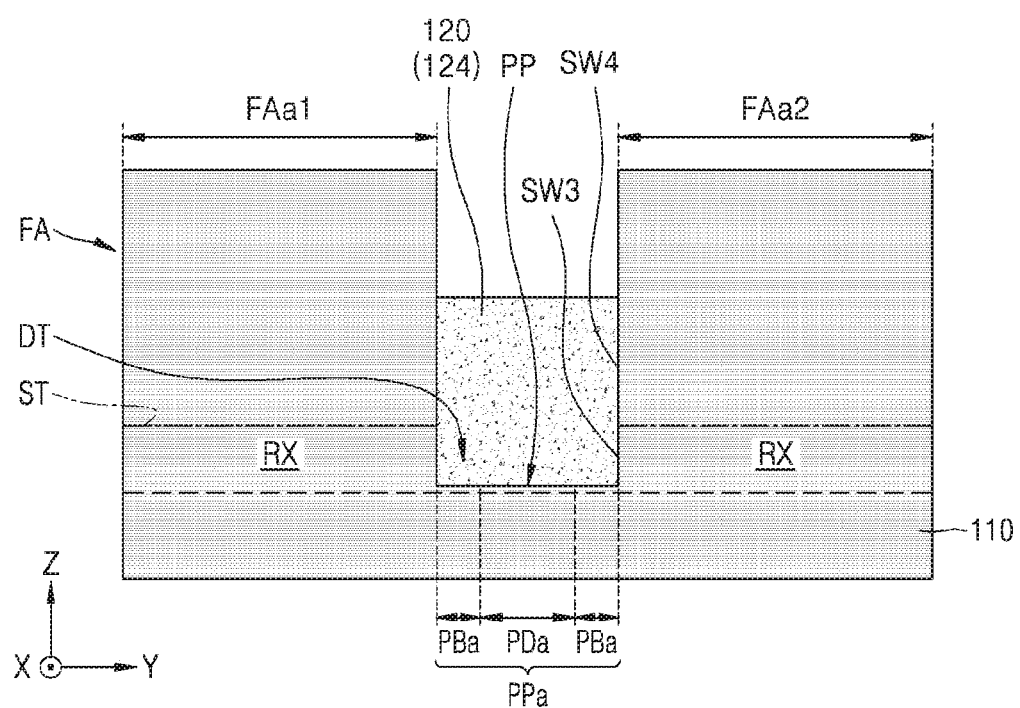

FIGS. 5A to 5D are a plan view and cross-sectional views illustrating a method of manufacturing a semiconductor device, according to some example embodiments of the present inventive concepts. In more detail, FIGS. 5B, 5C, and 5D are respective cross-sectional views taken along line B-B', line C-C', and line D-D' of FIG. 5A which is a plan view.

Referring to FIGS. 5A to 5D together, an isolation layer 120 including a first isolation layer 122 and a second isolation layer 124 respectively filling lower portions of the shallow trench ST and the deep trench DT is formed. The isolation layer 120 may cover a lower sidewall of the fin-shaped active region FA.

The isolation layer 120 may include a silicon-containing insulating film such as a silicon oxide layer, a silicon nitride layer, a silicon oxynitride layer, a silicon carbide nitride layer, and the like, polysilicon, or a combination thereof. The isolation layer 120 may be formed by plasma enhanced chemical vapor deposition (PECVD), high density plasma (HDP) CVD, inductively coupled plasma (ICP) CVD, capacitor coupled plasma (CCP) CVD, flowable CVD (FCVD), and/or a spin coating process. However, the present inventive concepts are not limited thereto.

The isolation layer 120 is formed to cover both the upper surface and the sidewall of the fin-shaped active region FA and then is partially removed to reduce/lower an upper surface of the isolation layer 120. For example, the isolation layer 120 may be formed by performing a recess process to expose the upper surface and an upper sidewall of the fin-shaped active region FA. Dry etching, wet etching, or a combination of dry etching and wet etching may be used to perform the recess process.

For the recess process of the isolation layer 120, a wet etching process using $NH_4OH$, tetramethyl ammonium hydroxide (TMAH), potassium hydroxide (KOH) solution, or the like as an etchant, or a dry etching process such as an inductively coupled plasma (ICP), transformer coupled plasma (TCP), electron cyclotron resonance (ECR), reactive ion etch (RIE), or the like may be used. When the recess process of the isolation layer 120 is performed by dry etching, a fluorine-containing gas such as $CF_4$ or the like, or a chlorine-containing gas such as $Cl_2$, HBr or the like may be used, but the present inventive concepts are not limited thereto.

In some example embodiments, the isolation layer 120 may have a composite film structure. For example, the isolation layer 120 may include first and second liners sequentially stacked on an inner wall of each of the shallow trench ST and the deep trench DT, and a gap-fill insulating layer formed on the second liner. The first liner may include, e.g., an oxide such as a silicon oxide, the second liner may include, e.g., polysilicon or a nitride such as a silicon nitride, and the gap-fill insulating layer may include, e.g., an oxide such as a silicon oxide.

In some example embodiments, the first isolation layer 122 and the second isolation layer 124 are formed together and may include an identical material. In some example embodiments, a first portion of the second isolation layer 124 may be formed with the first isolation layer 122, and a remaining/second portion of the second isolation layer 124 may be formed separately from the first isolation layer 122. In some example embodiments, the first isolation layer 122 and the second isolation layer 124 may be formed separately.

The isolation layer 120 may cover the lower sidewall of the fin-shaped active region FA and not cover the upper sidewall of the fin-shaped active region FA. The upper sidewall of the fin-shaped active region FA that is not covered by the isolation layer 120 may be a channel region. The protruding pattern PP may be covered with the isolation layer 120.

The third sidewall SW3 of the device region RX may be covered with the isolation layer 120. A lower portion of the fourth sidewall SW4 of the fin-shaped active region FA may be covered by the isolation layer 120 and an upper portion of the same may not be covered by the isolation layer 120.

In some example embodiments, an upper edge of the fin-shaped active region FA is partially removed so that an upper end of the fin-shaped active region FA may have a rounded shape. In some example embodiments, a width of a portion of the fin-shaped active region FA exposed on/by the upper surface of the isolation layer 120 in the fin-shaped active region FA may be narrower than the fin-shaped active regions FA shown in FIGS. 4B and 4C. Also, the upper end of the fin-shaped active region FA may have a rounded shape.

In some example embodiments, an impurity ion implantation process for threshold voltage adjustment may be performed on an upper portion of the fin-shaped active region FA. During the impurity ion implantation process for threshold voltage adjustment, boron (B) ions may be implanted as an impurity when an n-channel metal-oxide-semiconductor (NMOS) transistor is formed, and phosphorus (P) or arsenic (As) may be implanted as an impurity when a p-channel metal-oxide-semiconductor (PMOS) transistor is formed.

Figure 6A:
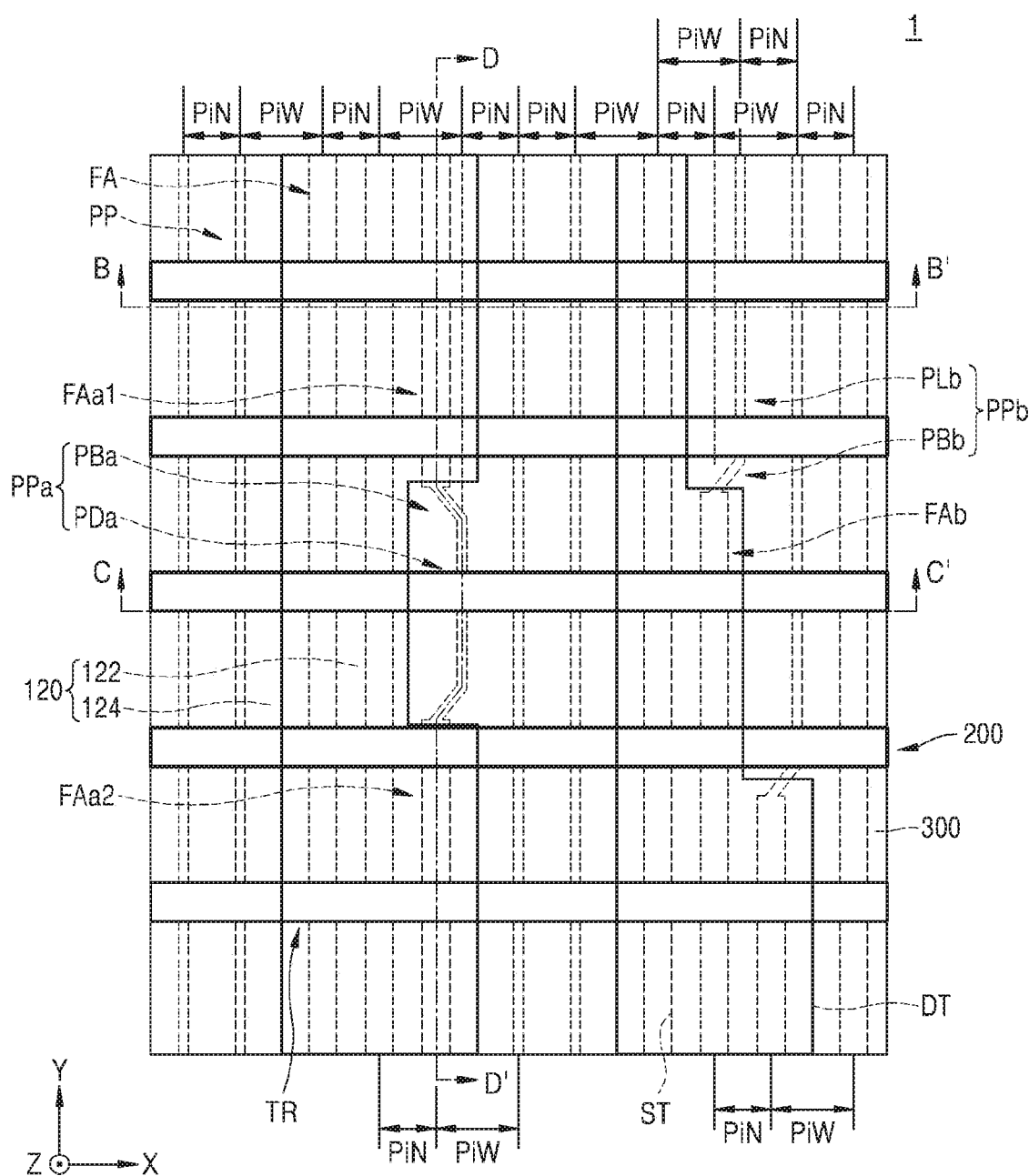
FIG. 6A is a plan view.
Figure 6B:
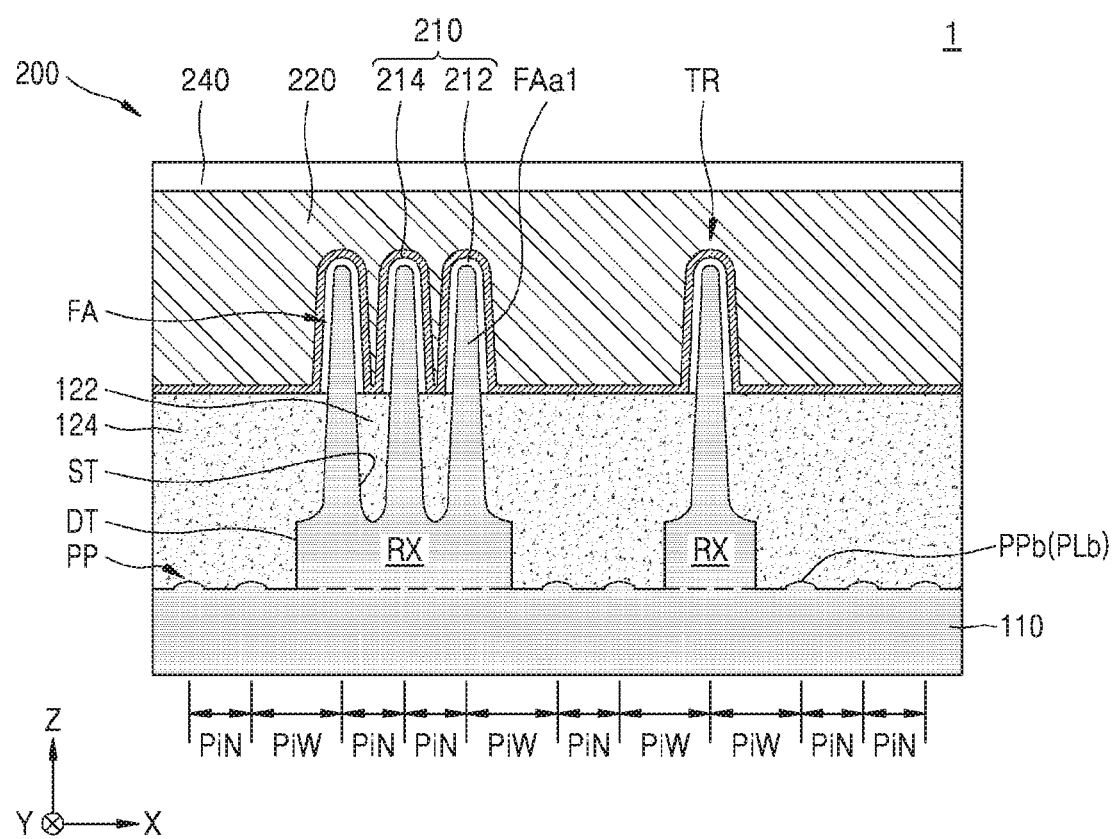
FIGS. 6B to 6D are cross-sectional views, of a configuration of a semiconductor device, according to some example embodiments of the present inventive concepts.
Figure 6C:
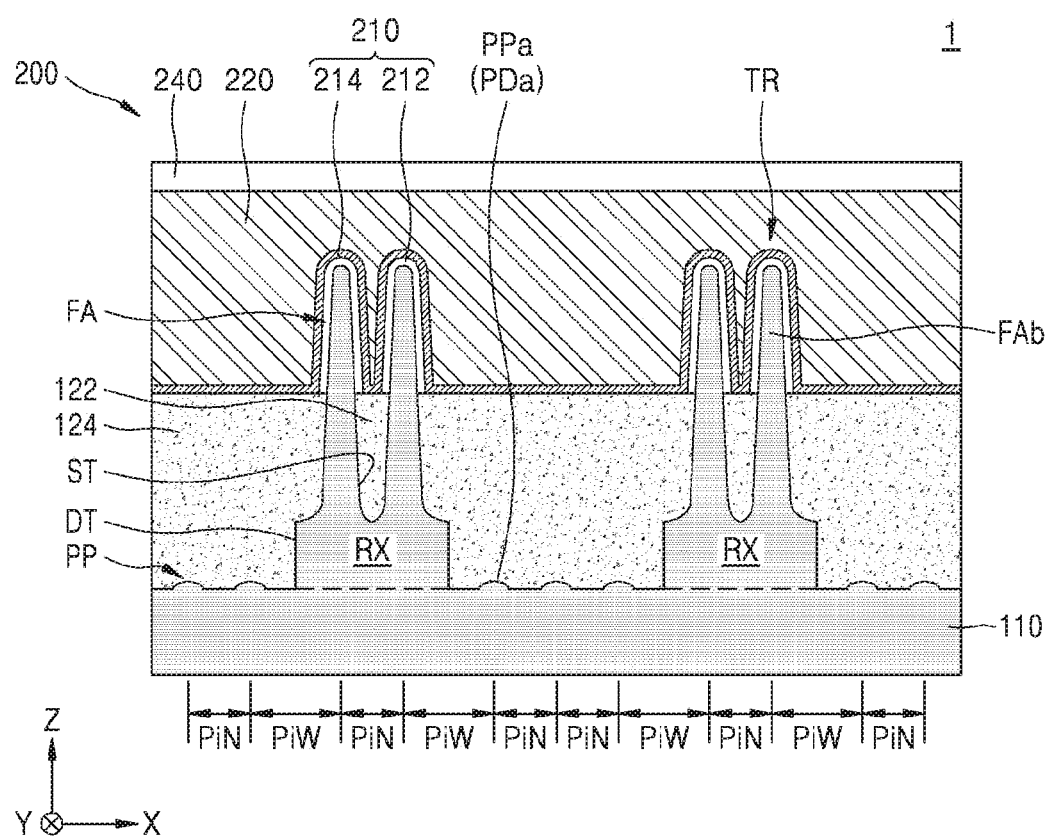
Figure 6D:
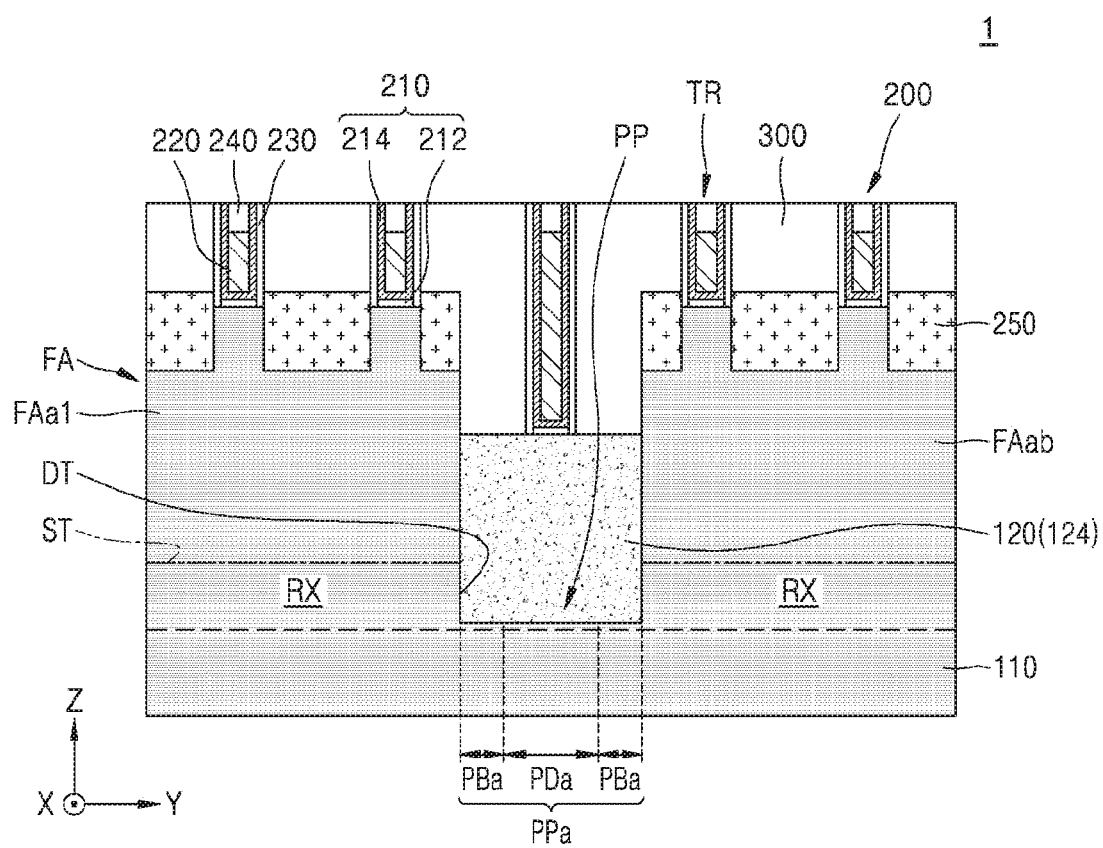

FIGS. 6A to 6D are a plan view and cross-sectional views of a configuration of a semiconductor device, according to some example embodiments of the present inventive concepts. In more detail, FIGS. 6B, 6C, and 6D are respective cross-sectional views taken along line B-B', line C-C', and line D-D' of FIG. 6A which is a plan view.

Referring to FIGS. 6A to 6D together, a plurality of gate structures 200 extend across the fin-shaped active region FA and in the first direction (X direction). An extending direction (X direction) of a gate structure 200 and an extending direction (Y direction) of the fin-shaped active region FA may be orthogonal to each other.

The gate structure 200 includes a gate dielectric layer 210, a gate conductive layer 220, and a gate capping layer 240, which are sequentially formed on a surface of the fin-shaped active region FA. Insulating spacers 230 may be formed on both sides of the gate structure 200.

The gate dielectric layer 210 may cover an upper surface and both sidewalls of the fin-shaped active region FA. The gate conductive layer 220 may cover the gate dielectric layer 210 on the upper surface and both sidewalls of the fin-shaped active region FA. The gate conductive layer 220 may extend in the first direction (X direction). An extending direction (X direction) of the gate conductive layer 220 and the extending direction (Y direction) of the fin-shaped active region FA may be orthogonal to each other.

The gate dielectric layer 210 may include a silicon oxide, a silicon nitride, a silicon oxynitride, a gallium oxide, a germanium oxide, a high-k dielectric material, or a combination thereof.

The gate dielectric layer 210 may include an interface layer 212 having a first specific dielectric constant and a high (e.g., high-k) dielectric layer 214 formed on the interface layer 212 and having a second specific dielectric constant higher than the first specific dielectric constant. The interface layer 212 may be formed on an upper surface of the fin-shaped active regions FA and between portions of both sidewalls of the gate conductive layer 220 that are not covered by the isolation layer 120 and a bottom surface of the gate conductive layer 220 to face the bottom surface of the gate conductive layer 220, and the high dielectric layer 214 may face the bottom surface and the both sidewalls of the gate conductive layer 220.

The interface layer 212 may include, but is not limited to, a low-k material having a specific dielectric constant of 9 or less, such as a silicon oxide, a silicon nitride, a silicon oxynitride, a gallium oxide, or a germanium oxide. The interface layer 212 may be an oxide, a nitride, or an oxynitride forming the substrate 110. The interface layer 212 may have a thickness of, e.g., about 5 Å to about 20 Å, but is not limited thereto. The interface layer 212 may be formed by thermal oxidation, atomic layer deposition (ALD), chemical vapor deposition (CVD), or physical vapor deposition (PVD).

The high dielectric layer 214 may include a high-k material having a specific dielectric constant of about 10 to about 25 that is larger than that of the interface layer 212. The high dielectric layer 214 may include, e.g., a material having a specific dielectric constant larger than those of a silicon oxide layer and a silicon nitride layer. The high dielectric layer 214 may include a material selected from hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, erbium oxide, dysprosium oxide, gadolinium oxide, aluminum oxide, lead scandium tantalum oxide, lead zinc niobate, and a combination thereof, but is not limited thereto. The high dielectric layer 214 may be formed by ALD, CVD, or PVD. The high dielectric layer 214 may have a thickness of, e.g., about 10 Å to about 40 Å, but is not limited thereto.

In some example embodiments, the interface layer 212 may be formed only between the upper surface of the fin-shaped active regions FA exposed by a thermal oxidation process and the gate conductive layer 220, but is not limited thereto. For example, when the interface layer 212 is formed by thermal oxidation, ALD, CVD, or PVD, the interface layer 212 may cover a lower surface of the gate conductive layer 220, completely.

The gate conductive layer 220 may include, e.g., at least one metal selected from titanium (Ti), tantalum (Ta), aluminum (Al), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd), a metal nitride including at least one metal, and a metal compound such as a carbon-doped metal or a carbon-doped metal nitride.

The gate conductive layer 220 may be a single layer or a multilayer including a plurality of films. The gate conductive layer 220 may include a metal-containing layer for work function adjustment and a metal-containing layer for filling a gap formed in an upper portion of the metal-containing layer for work function adjustment.

In some example embodiments, the gate conductive layer 220 may have a structure in which a metal nitride layer, a metal layer, a conductive capping layer, and a gap-fill metal layer are sequentially stacked. The metal nitride layer and the metal layer may each include at least one metal atom selected from Ti, W, Ru, Nb, Mo, Hf, Ni, Co, Pt, Yb, Tb, Dy, Er, and Pd. The metal nitride layer and the metal layer may be formed by the ALD process, a metal organic ALD (MOALD) process, or a metal organic CVD (MOCVD) process. The conductive capping layer may act as a protective layer for inhibiting/preventing oxidation of a surface of the metal layer. In addition, the conductive capping layer may act as a wetting layer for making a deposition of another conductive layer on the metal layer easier. The conductive capping layer may include a metal nitride layer, e.g., titanium nitride (TiN), tantalum nitride (TaN), or a combination thereof, but is not limited thereto. The gap-fill metal layer may extend on the conductive capping layer. The gap-fill metal layer may include a W layer. The gap-fill metal layer may be formed by the ALD, the CVD, or the PVD process. The gap-fill metal layer may embed a recess space formed by a step between areas on an upper surface of the conductive capping layer without a void. In some example embodiments, the gate conductive layer 220 may include a stack structure of TiAlC/TiN/W, a stack structure of TiN/TaN/TiAlC/TiN/W, or a stack structure of TiN/TaN/TiN/TiAlC/TiN/W. In the above stack structures, the TiAlC layer or the TiN layer may function as a layer containing metal for adjusting the work function.

In some example embodiments, the gate dielectric layer 210 and the gate conductive layer 220 may be formed by first forming a dummy gate layer and the insulating spacers 230 and then filling a gap between the insulating spacers 230 from which a dummy gate is removed.

A pair of impurity regions 250 may be formed on both/opposite sides of the gate conductive layer 220 in the fin-shaped active region FA. In some example embodiments, the pair of impurity regions 250 may be formed by implanting impurities into portions of the fin-shaped active region FA exposed on the both sides of the gate structure 200. In some example embodiments, the pair of impurity regions 250 may be a semiconductor layer that is epitaxially grown from the fin-shaped active region FA after removing the portions of the fin-shaped active region FA exposed on the both sides of the gate structure 200. The pair of impurity regions 250 may be/include a source region and a drain region.

An impurity region 250 may include a material having a lattice constant larger than that of the fin-shaped active region FA. The impurity region 250 may include a different group of compound semiconductor materials, respectively. For example, the impurity region 250 may include a group III-V compound semiconductor material or a group II-VI compound semiconductor material.

In some example embodiments, at least a portion of the impurity region 250 may include a crystalline group III-V compound semiconductor material having a lattice constant larger than that of silicon by 7.5% or more, or a crystalline group II-VI compound semiconductor material. For example, at least a portion of the impurity region 250 may include a group III-V compound semiconductor material such as GaSb, AlSb, and InP, or a group II-VI compound semiconductor material such as CdSe, MgSe, ZnTe, MgTe, and GdTe. GaSb, AlSb, InP, CdSe, MgSe, ZnTe, MgTe, and CdTe may have lattice constants of 6.096 Å, 6.136 Å, 5.869 Å 6.05 Å, 5.873 Å, 6.101 Å, 6.417 Å and 6.48 Å, respectively.

In some example embodiments, a portion of the impurity region 250 may include an amorphous group III-V compound semiconductor material or an amorphous group II-VI family compound semiconductor material. For example, at least a portion of the impurity region 250 may include an amorphous layer of a group III-V compound semiconductor material such as GaSb, AlSb, and InP, or an amorphous layer of a group II-VI compound semiconductor material such as CdSe, MgSe, ZnTe, MgTe, and GdTe.

In some example embodiments, the pair of impurity regions 250 may protrude upward from the upper surface of the fin-shaped active regions FA.

An insulating spacer 230 may include, e.g., a silicon nitride layer, a silicon oxynitride layer, a carbon-containing silicon oxynitride layer, or a composite layer thereof, or may have an air gap or a low dielectric layer therein. The gate capping layer 240 may include, e.g., a silicon nitride layer.

An interlayer insulating layer 300 may be formed on (e.g. to cover) the insulating spacers 230 on the opposite side of the gate structure 200 with respect to the insulating spacers 230. The interlayer insulating layer 300 may include, e.g., a silicon oxide layer such as tetra-ethyl-ortho-silicate (TEOS).

A transistor TR may be formed at a portion where the fin-shaped active region FA and the gate conductive layer 220 intersect with each other. The transistor TR includes a MOS transistor of a three-dimensional (3D) structure in which a channel is formed on an upper surface and both sidewalls of the fin-shaped active region FA.

In some example embodiments, the semiconductor device 1 may further include a nanosheet stack structure facing the upper surface of the fin-shaped active regions FA at a position spaced apart from the upper surface of the fin-shaped active regions FA. The nanosheet stack structure may include a plurality of nanosheets extending parallel to the upper surface of the fin-shaped active regions FA. The plurality of nanosheets may include a channel region. A gate conductive layer 220 may surround at least a portion of the channel region. The nanosheets may include a group IV semiconductor, a group IV-IV compound semiconductor, or a group III-V compound semiconductor. For example, the nanosheets may include Si, Ge, or SiGe, or may include InGaAs, InAs, GaSb, InSb, or a combination thereof. When the semiconductor device 1 further includes a nanosheet stack structure, the gate dielectric layer 210 may be interposed between the channel region and the gate conductive layer 220. The impurity region 250 may be in contact with both ends of the plurality of nanosheets and the both ends of the plurality of nanosheets adjacent to the impurity region 250 may be covered with the insulating spacers 230 covering the sidewalls of the gate conductive layer 220. A pair of inner insulating spacers may be formed between the fin-shaped active region FA and the nanosheets. The pair of inner insulating spacers may be interposed between the gate conductive layer 220 and the impurity region 250. The inner insulating spacer may include a material different from that of the gate dielectric layer 210. The inner insulating spacer may include a material having a dielectric constant less than that of the material constituting the gate dielectric layer 210. For example, the inner insulating spacer may include, but is not limited to, an oxide of a material constituting the nanosheets. The gate dielectric layer 210 may extend from a surface of the channel region of the nanosheets to the sidewall surface of the inner insulating spacer so as to be interposed between the gate conductive layer 220 and the inner insulating spacer.

The semiconductor device 1 according to some example embodiments of the present inventive concepts may include the plurality of fin-shaped active regions FA extending in the second direction (Y direction) and the plurality of protruding patterns PP extending substantially in the second direction (Y direction).

Portions of the plurality of fin-shaped active regions FA, which are adjacent to each other, may be arranged with the first pitch PiN. Portions of the plurality of protruding patterns PP, which are adjacent to each other and extend in the second direction (Y direction), may be arranged with the first pitch PiN. Respective portions of the plurality of fin-shaped active regions FA and the plurality of protruding patterns PP, which are adjacent to each other and extend in the second direction (Y direction), may be arranged with the second pitch PiW that is larger than the first pitch PiN.

The protruding pattern PP is a portion remaining on the substrate 110 at the bottom surface of the deep trench DT after a portion of the preliminary fin-shaped active regions PFA (FIGS. 4A to 4D) is removed, so that respective portions of the plurality of fin-shaped active regions FA and the plurality of protruding patterns PP, which are adjacent to each other and extend in the second direction (Y direction), are arranged with the first sidewall SW1 (of FIGS. 3A to 3D) of the second mask pattern M2 (of FIGS. 3A to 3D) therebetween. Since the first sidewall SW1 of the second mask pattern M2 is located between portions of the preliminary fin-shaped active regions PFA adjacent to each other at the relatively large second pitch PiW, it may be possible to obtain a sufficient etching process margin when forming the second mask pattern M2 or performing an etching process for removing a portion of the preliminary fin-shaped active regions PFA by using the second mask pattern M2 as an etching mask. Thus, it may be possible to inhibit/prevent the performance of the semiconductor device 1 from deteriorating or the semiconductor device 1 from including defects as a portion of the preliminary fin-shaped active regions PFA, which is not to be removed, is actually removed, or a portion of the preliminary fin-shaped active regions PFA, which is to be removed, remains as is.

A semiconductor device according to the present inventive concepts may not suffer from performance degradation or defects because a portion of a preliminary fin-shaped active region for forming a fin-shaped active region, which is desired not to be removed, is not removed and a portion desired to be removed does not remain.

Although the present inventive concepts have been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A method of manufacturing a semiconductor device, the method comprising:
   forming a plurality of first mask patterns spaced apart from each other on a substrate by performing an extreme ultraviolet lithography (EUV) process;
   forming a plurality of preliminary fin-shaped active regions spaced apart from each other using the plurality of first mask patterns as an etch mask;
   forming a second mask pattern on the plurality of preliminary fin-shaped active regions; and
   forming a device region defined by a trench in the substrate, a plurality of fin-shaped active regions spaced apart from each other in the device region and extending in a first direction, and a plurality of protruding patterns extending along a bottom surface of the trench using the second mask pattern as an etch mask;
   wherein a first interval between the plurality of protruding patterns and the plurality of fin-shaped active regions is greater than a second interval between two adjacent ones of the plurality of fin-shaped active regions, and
   wherein first and second ends of one of the plurality of protruding patterns are in contact with first and second lower ends of first and second sidewalls of the device region, respectively.

2. The method of manufacturing a semiconductor device of claim 1, further comprising:
   forming an isolation layer on lower portions of fin sidewalls of the plurality of fin-shaped active regions, on the first and second sidewalls of the device region, and on the plurality of protruding patterns; and
   forming a plurality of gate structures spaced apart from each other in the first direction and extending in a second direction on the isolation layer and on the plurality of fin-shaped active regions, each of the plurality of gate structures comprising a gate dielectric layer and a gate conductive layer.

3. The method of manufacturing a semiconductor device of claim 1, wherein the plurality of fin-shaped active regions comprises first and second fin sidewalls extending upward from the first and second sidewalls, respectively, of the device region.

4. The method of manufacturing a semiconductor device of claim 1,
wherein the plurality of fin-shaped active regions comprise a first fin-shaped extension portion and a second fin-shaped extension portion that are spaced apart from each other and are collinear in the first direction.

5. The method of manufacturing a semiconductor device of claim 4,
wherein the first lower end of the first sidewall is under a first fin sidewall of the first fin-shaped extension portion,
wherein the second lower end of the second sidewall is under a second fin sidewall of the second fin-shaped extension portion, and
wherein the one of the plurality of protruding patterns comprises a curved protruding pattern comprising a first portion extending in a third direction oblique to the first direction and a second direction.

6. The method of manufacturing a semiconductor device of claim 5, wherein a second portion of the curved protruding pattern extends in the first direction and is not collinear with the first fin-shaped extension portion and the second fin-shaped extension portion, the first portion extending from the second portion to the first lower end of the first sidewall of the device region.

7. The method of manufacturing a semiconductor device of claim 6,
wherein the first sidewall of the device region is aligned with the first fin sidewall of the first fin-shaped extension portion, and
wherein the second sidewall of the device region is aligned with the second fin sidewall of the second fin-shaped extension portion.

8. The method of manufacturing a semiconductor device of claim 7,
wherein the plurality of fin-shaped active regions comprises a straight fin-shaped active region extending in the first direction in parallel with the first and second fin-shaped extension portions,
wherein the straight fin-shaped active region is spaced apart from the first and second fin-shaped extension portions at the second interval,
wherein the plurality of protruding patterns comprises a straight protruding pattern extending in the first direction in parallel with the first and second fin-shaped extension portions, and
wherein the straight protruding pattern is spaced apart from the first and second fin-shaped extension portions at the first interval.

9. The method of manufacturing a semiconductor device of claim 8,
wherein the straight fin-shaped active region is spaced apart from the second portion at the first interval, and
wherein the straight protruding pattern is spaced apart from the second portion at the second interval.

10. The method of manufacturing a semiconductor device of claim 6, wherein a third interval between the second portion and an axis on which the first fin-shaped extension portion and the second fin-shaped extension portion are collinear is equal to a difference between the first interval and the second interval.

11. The method of manufacturing a semiconductor device of claim 1, wherein adjacent ones of the plurality of protruding patterns are spaced apart from each other at the second interval in a second direction.

12. A method of manufacturing a semiconductor device, the method comprising:
forming a plurality of first mask patterns spaced apart from each other on a substrate;
forming a plurality of preliminary fin-shaped active regions spaced apart from each other with a shallow trench therebetween by removing portions of the substrate using the plurality of first mask patterns as an etch mask;
forming a second mask pattern on the plurality of preliminary fin-shaped active regions; and
forming a device region defined by a deep trench in the substrate, a plurality of fin-shaped active regions spaced apart from each other at a first pitch in the device region and extending in a first direction, and a plurality of protruding patterns extending along a bottom surface of the deep trench by removing further portions of the substrate and portions of the plurality of preliminary fin-shaped active regions using the second mask pattern as an etch mask;
wherein the plurality of protruding patterns and the plurality of fin-shaped active regions are spaced apart from each other at a second pitch greater than the first pitch in a second direction different from the first direction, and
wherein a longitudinal dimension of a first portion of one of the plurality of protruding patterns is in the first direction and a longitudinal dimension of a second portion of the one of the plurality of protruding patterns is in a third direction oblique to the first direction and the second direction.

13. The method of manufacturing a semiconductor device of claim 12,
wherein two adjacent ones of the plurality of protruding patterns are spaced apart from each other at the first pitch in the second direction.

14. The method of manufacturing a semiconductor device of claim 12, wherein first and second ends of the one of the plurality of protruding patterns are in contact with first and second lower ends of first and second sidewalls of the device region, respectively.

15. The method of manufacturing a semiconductor device of claim 14, wherein a fin sidewall of one of the plurality of fin-shaped active regions is on one of the first and second sidewalls of the device region.

16. The method of manufacturing a semiconductor device of claim 12, wherein the plurality of first mask patterns are formed by performing an extreme ultraviolet lithography process.

17. A method of manufacturing a semiconductor device, the method comprising:
forming a plurality of first mask patterns spaced apart from each other on a substrate by performing an extreme ultraviolet lithography (EUV) process;
forming a plurality of preliminary fin-shaped active regions spaced apart from each other with a shallow trench therebetween by removing portions of the substrate using the plurality of first mask patterns as an etch mask;
forming a second mask pattern on the plurality of preliminary fin-shaped active regions;
forming a device region defined by a deep trench in the substrate, a plurality of fin-shaped active regions spaced apart from each other in the device region and extending in a first direction, and a plurality of protruding patterns extending along a bottom surface of the deep trench by removing further portions of the substrate and portions of the plurality of preliminary fin-shaped active regions using the second mask pattern as an etch mask;

forming an isolation layer on lower portions of fin sidewalls of the plurality of fin-shaped active regions, on a sidewall of the device region, and on the plurality of protruding patterns; and forming a plurality of gate structures spaced apart from each other in the first direction and extending in a second direction perpendicular to the first direction on the isolation layer and on the plurality of fin-shaped active regions, each of the plurality of gate structures comprising a gate dielectric layer and a gate conductive layer, wherein adjacent ones of the plurality of fin-shaped active regions are spaced apart from each other at a first pitch in the second direction, wherein the plurality of protruding patterns and the plurality of fin-shaped active regions are spaced apart from each other at a second pitch in the second direction, the second pitch being greater than the first pitch, wherein a lower end of the sidewall of the device region comprises a first lower end of a first sidewall of the device region, and wherein the one of the plurality of protruding patterns extends from the first lower end of the first sidewall to a second lower end of a second sidewall of the device region.

18. The method of manufacturing a semiconductor device of claim 17, further comprising:

forming a mold layer in the shallow trench and on the plurality of preliminary fin-shaped active regions, wherein the second mask pattern is formed on the mold layer.

19. The method of manufacturing a semiconductor device of claim 17, wherein a longitudinal dimension of a first portion of the one of the plurality of protruding patterns is in the first direction and a longitudinal dimension of a second portion of the one of the plurality of protruding patterns is in a third direction oblique to the first direction and the second direction.

20. The method of manufacturing a semiconductor device of claim 17, wherein adjacent ones of the plurality of protruding patterns are spaced apart from each other at the first pitch in the second direction.

* * * * *